(12) United States Patent
Haba et al.

(10) Patent No.: US 11,901,281 B2
(45) Date of Patent: Feb. 13, 2024

(54) BONDED STRUCTURES WITH INTEGRATED PASSIVE COMPONENT

(71) Applicant: ADEIA SEMICONDUCTOR BONDING TECHNOLOGIES INC., San Jose, CA (US)

(72) Inventors: Belgacem Haba, Saratoga, CA (US); Javier A. DeLaCruz, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 16/298,466

(22) Filed: Mar. 11, 2019

(65) Prior Publication Data

US 2020/0294908 A1 Sep. 17, 2020

(51) Int. Cl.
*H01L 23/522* (2006.01)
*H01L 23/538* (2006.01)
(Continued)

(52) U.S. Cl.
CPC ...... *H01L 23/5223* (2013.01); *H01L 23/5226* (2013.01); *H01L 23/5286* (2013.01);
(Continued)

(58) Field of Classification Search
CPC ............ H01L 23/5223; H01L 23/5226; H01L 23/5286; H01L 23/5383; H01L 24/17; H01L 2924/1205
See application file for complete search history.

(56) References Cited

U.S. PATENT DOCUMENTS

| 4,998,665 A | 3/1991 | Hayashi |
| 5,087,585 A | 2/1992 | Hayashi |

(Continued)

FOREIGN PATENT DOCUMENTS

| EP | 1 441 410 B1 | 4/2006 |
| JP | 2000-100679 | 4/2000 |

(Continued)

OTHER PUBLICATIONS

International Search Report and Written Opinion dated Mar. 7, 2019, in International Application No. PCT/US2018/060044, 14 pages.

(Continued)

*Primary Examiner* — Phat X Cao
(74) *Attorney, Agent, or Firm* — Knobbe, Martens, Olson & Bear LLP

(57) ABSTRACT

In various embodiments, a passive electronic component is disclosed. The passive electronic component can have a first surface and a second surface opposite the first surface. The passive electronic component can include a nonconductive material and a capacitor embedded within the nonconductive material. The capacitor can have a first electrode, a second electrode, and a dielectric material disposed between the first and second electrodes. The first electrode can comprise a first conductive layer and a plurality of conductive fibers extending from and electrically connected to the first conductive layer. A first conductive via can extend through the passive electronic component from the first surface to the second surface, with the first conductive via electrically connected to the first electrode.

26 Claims, 26 Drawing Sheets

(51) Int. Cl.
*H01L 23/528* (2006.01)
*H01L 49/02* (2006.01)
*H01L 25/16* (2023.01)
*H01L 23/00* (2006.01)

(52) U.S. Cl.
CPC ...... *H01L 23/5383* (2013.01); *H01L 23/5389* (2013.01); *H01L 24/17* (2013.01); *H01L 25/16* (2013.01); *H01L 28/60* (2013.01); *H01L 2924/1205* (2013.01)

(56) References Cited

U.S. PATENT DOCUMENTS

| | | | |
|---|---|---|---|
| 5,322,593 | A | 6/1994 | Hasegawa et al. |
| 5,408,053 | A | 4/1995 | Young |
| 5,471,090 | A | 11/1995 | Deutsch et al. |
| 5,753,536 | A | 5/1998 | Sugiyama et al. |
| 5,771,555 | A | 6/1998 | Eda et al. |
| 5,909,624 | A | 6/1999 | Yeager et al. |
| 5,985,739 | A | 11/1999 | Plettner et al. |
| 5,998,808 | A | 12/1999 | Matsushita |
| 6,008,126 | A | 12/1999 | Leedy |
| 6,080,640 | A | 6/2000 | Gardner et al. |
| 6,115,264 | A | 9/2000 | Nosaka |
| 6,265,775 | B1 | 7/2001 | Seyyedy |
| 6,374,770 | B1 | 4/2002 | Lee |
| 6,423,640 | B1 | 7/2002 | Lee et al. |
| 6,465,892 | B1 | 10/2002 | Suga |
| 6,638,808 | B1 | 10/2003 | Ochi |
| 6,713,871 | B2 | 3/2004 | Searls et al. |
| 6,759,692 | B1 | 7/2004 | Ochi |
| 6,887,769 | B2 | 5/2005 | Kellar et al. |
| 6,908,027 | B2 | 6/2005 | Tolchinsky et al. |
| 6,952,049 | B1 | 10/2005 | Ogawa et al. |
| 6,970,362 | B1 * | 11/2005 | Chakravorty ........... H01L 23/50 |
| | | | 257/E23.079 |
| 7,045,453 | B2 | 5/2006 | Canaperi et al. |
| 7,078,811 | B2 | 7/2006 | Suga |
| 7,105,980 | B2 | 9/2006 | Abbott et al. |
| 7,126,212 | B2 | 10/2006 | Enquist et al. |
| 7,193,423 | B1 | 3/2007 | Dalton et al. |
| 7,339,798 | B2 | 3/2008 | Chakravorty |
| 7,354,798 | B2 | 4/2008 | Pogge et al. |
| 7,355,836 | B2 | 4/2008 | Radhakrishnan et al. |
| 7,633,112 | B2 * | 12/2009 | Won .................. H01L 23/53223 |
| | | | 257/E29.345 |
| 7,705,691 | B2 | 4/2010 | Lu et al. |
| 7,741,724 | B2 | 6/2010 | Morikawa et al. |
| 7,746,663 | B2 | 6/2010 | Hashimoto |
| 7,750,488 | B2 | 7/2010 | Patti et al. |
| 7,803,693 | B2 | 9/2010 | Trezza |
| 8,143,135 | B2 * | 3/2012 | Kemerer ................. H01L 28/91 |
| | | | 438/386 |
| 8,183,127 | B2 | 5/2012 | Patti et al. |
| 8,222,104 | B2 | 7/2012 | Booth et al. |
| 8,241,961 | B2 | 8/2012 | Kim et al. |
| 8,314,007 | B2 | 11/2012 | Vaufredaz |
| 8,349,635 | B1 | 1/2013 | Gan et al. |
| 8,357,931 | B2 | 1/2013 | Schieck et al. |
| 8,377,798 | B2 | 2/2013 | Peng et al. |
| 8,441,131 | B2 | 5/2013 | Ryan |
| 8,476,146 | B2 | 7/2013 | Chen et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,698,323 | B2 | 4/2014 | Mohammed et al. |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,916,448 | B2 | 12/2014 | Cheng et al. |
| 8,970,003 | B2 | 3/2015 | Parris |
| 8,988,299 | B2 | 3/2015 | Kam et al. |
| 9,093,350 | B2 | 7/2015 | Endo et al. |
| 9,142,517 | B2 | 9/2015 | Liu |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,263,186 | B2 | 2/2016 | Li et al. |
| 9,299,649 | B2 * | 3/2016 | Chiu ................. H01L 23/49816 |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,368,866 | B2 | 6/2016 | Yu |
| 9,385,024 | B2 | 7/2016 | Tong et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,202 | B2 | 11/2016 | Hashimoto |
| 9,496,239 | B1 | 11/2016 | Edelstein et al. |
| 9,536,848 | B2 | 1/2017 | England et al. |
| 9,537,199 | B2 | 1/2017 | Dang et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,716,088 | B1 | 7/2017 | Edelstein et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,881,882 | B2 | 1/2018 | Hsu et al. |
| 9,893,004 | B2 | 2/2018 | Yazdani |
| 9,929,050 | B2 | 3/2018 | Lin |
| 9,941,241 | B2 | 4/2018 | Edelstein et al. |
| 9,941,243 | B2 | 4/2018 | Kim et al. |
| 9,947,655 | B2 | 4/2018 | Edelstein et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 * | 4/2019 | Kao .................. H01L 27/14636 |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,707,087 | B2 | 7/2020 | Uzoh et al. |
| 10,727,219 | B2 | 7/2020 | Uzoh et al. |
| 10,790,262 | B2 | 9/2020 | Uzoh et al. |
| 10,820,409 | B1 | 10/2020 | Felix |
| 10,840,135 | B2 | 11/2020 | Uzoh |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,606 | B2 | 10/2021 | Gao et al. |
| 11,171,117 | B2 | 11/2021 | Gao et al. |
| 11,176,450 | B2 | 11/2021 | Teig et al. |
| 11,256,004 | B2 | 2/2022 | Haba et al. |

(56) References Cited

U.S. PATENT DOCUMENTS

| | | | |
|---|---|---|---|
| 11,264,357 B1 | 3/2022 | DeLaCruz et al. | |
| 11,276,676 B2 | 3/2022 | Enquist et al. | |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 11,626,363 B2 | 4/2023 | Haba et al. | |
| 2002/0000328 A1 | 1/2002 | Motomura et al. | |
| 2002/0003307 A1 | 1/2002 | Suga | |
| 2003/0036244 A1* | 2/2003 | Jones | H01L 28/91 438/397 |
| 2003/0100189 A1* | 5/2003 | Lee | H01L 28/82 438/694 |
| 2004/0084414 A1 | 5/2004 | Sakai et al. | |
| 2004/0155692 A1 | 8/2004 | Ochi | |
| 2005/0135041 A1 | 6/2005 | Kang et al. | |
| 2005/0190808 A1 | 9/2005 | Yonekura et al. | |
| 2005/0231303 A1 | 10/2005 | Chang et al. | |
| 2005/0266652 A1* | 12/2005 | Chudzik | H01L 23/5223 438/387 |
| 2006/0012966 A1 | 1/2006 | Chakravorty | |
| 2006/0017144 A1 | 1/2006 | Uematsu et al. | |
| 2006/0057945 A1 | 3/2006 | Hsu et al. | |
| 2006/0145778 A1 | 7/2006 | Pleva et al. | |
| 2006/0278832 A1* | 12/2006 | Zentai | G01T 1/24 250/370.09 |
| 2007/0045814 A1 | 3/2007 | Yamamoto et al. | |
| 2007/0096294 A1 | 5/2007 | Ikeda et al. | |
| 2007/0111386 A1 | 5/2007 | Kim et al. | |
| 2007/0147014 A1 | 6/2007 | Chang et al. | |
| 2007/0222048 A1 | 9/2007 | Huang | |
| 2007/0295456 A1 | 12/2007 | Gudeman et al. | |
| 2008/0124835 A1 | 5/2008 | Chen et al. | |
| 2009/0051267 A1* | 2/2009 | Kato | H01J 9/025 445/50 |
| 2009/0108403 A1* | 4/2009 | Gogoi | H01L 28/91 257/532 |
| 2009/0206962 A1 | 8/2009 | Chou et al. | |
| 2009/0242252 A1 | 10/2009 | Tanaka | |
| 2010/0052099 A1 | 3/2010 | Chang et al. | |
| 2010/0132476 A1* | 6/2010 | Cheng | G01B 7/18 73/774 |
| 2010/0146779 A1 | 6/2010 | Honjo et al. | |
| 2010/0178418 A1* | 7/2010 | Tuncer | H01G 4/012 427/79 |
| 2010/0181645 A1* | 7/2010 | Marenco | H01L 27/0805 257/532 |
| 2010/0302012 A1 | 12/2010 | Roesner | |
| 2011/0115579 A1 | 5/2011 | Rofougaran | |
| 2011/0175215 A1 | 7/2011 | Farooq et al. | |
| 2011/0290552 A1 | 12/2011 | Palmateer et al. | |
| 2012/0013499 A1 | 1/2012 | Hayata | |
| 2012/0147516 A1 | 6/2012 | Kim et al. | |
| 2012/0168217 A1 | 7/2012 | Hsu et al. | |
| 2012/0212384 A1 | 8/2012 | Kam et al. | |
| 2013/0009325 A1 | 1/2013 | Mori et al. | |
| 2013/0032952 A1 | 2/2013 | Cho et al. | |
| 2013/0063863 A1 | 3/2013 | Timler et al. | |
| 2013/0105943 A1 | 5/2013 | Lai et al. | |
| 2013/0164905 A1* | 6/2013 | Yang | H01L 25/0657 438/386 |
| 2013/0207234 A1 | 8/2013 | Ikeda et al. | |
| 2013/0242517 A1 | 9/2013 | Fujidai et al. | |
| 2013/0265733 A1 | 10/2013 | Herbsommer et al. | |
| 2013/0286544 A1 | 10/2013 | Azais | |
| 2014/0001568 A1 | 1/2014 | Wang et al. | |
| 2014/0048908 A1 | 2/2014 | Chen et al. | |
| 2014/0116761 A1 | 5/2014 | Lee et al. | |
| 2014/0145338 A1 | 5/2014 | Fujii et al. | |
| 2014/0151100 A1 | 6/2014 | Yu et al. | |
| 2014/0175629 A1 | 6/2014 | Sun et al. | |
| 2014/0175655 A1 | 6/2014 | Chen et al. | |
| 2014/0184351 A1 | 7/2014 | Bae et al. | |
| 2014/0225795 A1 | 8/2014 | Yu | |
| 2014/0252635 A1 | 9/2014 | Tran et al. | |
| 2014/0264751 A1 | 9/2014 | Chen et al. | |
| 2014/0264948 A1 | 9/2014 | Chou et al. | |
| 2014/0273347 A1 | 9/2014 | Tseng et al. | |
| 2014/0370658 A1 | 12/2014 | Tong et al. | |
| 2014/0377946 A1 | 12/2014 | Cha et al. | |
| 2015/0062846 A1 | 3/2015 | Kim et al. | |
| 2015/0064498 A1 | 3/2015 | Tong | |
| 2015/0097298 A1 | 4/2015 | Chen et al. | |
| 2015/0194379 A1 | 7/2015 | Chen et al. | |
| 2015/0206902 A1 | 7/2015 | Cheng et al. | |
| 2015/0221571 A1 | 8/2015 | Chaparala et al. | |
| 2015/0235952 A1 | 8/2015 | Pan et al. | |
| 2015/0270209 A1 | 9/2015 | Woychik et al. | |
| 2015/0318618 A1 | 11/2015 | Chen et al. | |
| 2016/0049361 A1 | 2/2016 | Wang et al. | |
| 2016/0077294 A1 | 3/2016 | Jou et al. | |
| 2016/0111404 A1 | 4/2016 | Sanders et al. | |
| 2016/0155677 A1 | 6/2016 | Bonart et al. | |
| 2016/0197630 A1 | 7/2016 | Kawasaki | |
| 2016/0233195 A1 | 8/2016 | Nagai | |
| 2016/0254345 A1 | 9/2016 | Singh et al. | |
| 2016/0309578 A1 | 10/2016 | Park | |
| 2016/0343682 A1 | 11/2016 | Kawasaki | |
| 2016/0372449 A1 | 12/2016 | Rusu et al. | |
| 2017/0019086 A1 | 1/2017 | Dueweke | |
| 2017/0062366 A1 | 3/2017 | Enquist | |
| 2017/0062409 A1 | 3/2017 | Basker et al. | |
| 2017/0179029 A1 | 6/2017 | Enquist et al. | |
| 2017/0194271 A1 | 7/2017 | Hsu et al. | |
| 2017/0200711 A1 | 7/2017 | Uzoh et al. | |
| 2017/0338214 A1 | 11/2017 | Uzoh et al. | |
| 2017/0343498 A1 | 11/2017 | Kalnitsky et al. | |
| 2018/0096931 A1 | 4/2018 | Huang et al. | |
| 2018/0174995 A1 | 6/2018 | Wang et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0191047 A1 | 7/2018 | Huang et al. | |
| 2018/0219038 A1 | 8/2018 | Gambino et al. | |
| 2018/0226375 A1 | 8/2018 | Enquist et al. | |
| 2018/0273377 A1 | 9/2018 | Katkar et al. | |
| 2018/0286805 A1 | 10/2018 | Huang et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0096071 A1 | 3/2019 | Uzoh et al. | |
| 2019/0096842 A1 | 3/2019 | Fountain, Jr. et al. | |
| 2019/0115277 A1 | 4/2019 | Yu et al. | |
| 2019/0131277 A1 | 5/2019 | Yang et al. | |
| 2019/0198407 A1 | 6/2019 | Huang et al. | |
| 2019/0198409 A1 | 6/2019 | Katkar et al. | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0385935 A1 | 12/2019 | Gao et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0035641 A1 | 1/2020 | Fountain, Jr. et al. | |
| 2020/0075520 A1 | 3/2020 | Gao et al. | |
| 2020/0075534 A1 | 3/2020 | Gao et al. | |
| 2020/0075553 A1 | 3/2020 | DeLaCruz et al. | |
| 2020/0091063 A1* | 3/2020 | Chen | H01L 25/0657 |
| 2020/0118973 A1 | 4/2020 | Wang et al. | |
| 2020/0126906 A1 | 4/2020 | Uzoh et al. | |
| 2020/0194396 A1 | 6/2020 | Uzoh | |
| 2020/0227367 A1 | 7/2020 | Haba et al. | |
| 2020/0243380 A1 | 7/2020 | Uzoh et al. | |
| 2020/0279821 A1 | 9/2020 | Haba et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0335408 A1 | 10/2020 | Gao et al. | |
| 2020/0371154 A1 | 11/2020 | DeLaCruz et al. | |
| 2020/0395321 A1 | 12/2020 | Katkar et al. | |
| 2020/0411483 A1 | 12/2020 | Uzoh et al. | |

(56) References Cited

U.S. PATENT DOCUMENTS

| | | |
|---|---|---|
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |

FOREIGN PATENT DOCUMENTS

| | | |
|---|---|---|
| JP | 2001-102479 | 4/2001 |
| JP | 2002-353416 | 12/2002 |
| JP | 2003-043281 | 2/2003 |
| JP | 2005-191156 | 7/2005 |
| JP | 2008-258258 | 10/2008 |
| JP | 2013-33786 | 2/2013 |
| JP | 2014-131039 | 7/2014 |
| JP | 2014-192321 | 10/2014 |
| JP | 2018-160519 | 10/2018 |
| KR | 10-2006-0105797 | 10/2006 |
| KR | 10-2015-0097798 | 8/2015 |
| WO | WO 2005/043584 A2 | 5/2005 |
| WO | WO 2005/064646 A2 | 7/2005 |
| WO | WO 2006/100444 A1 | 9/2006 |
| WO | WO 2012/005236 A1 | 1/2012 |
| WO | WO 2012/125237 A2 | 9/2012 |
| WO | WO 2016/170894 A1 | 10/2016 |
| WO | WO 2017/151442 A1 | 9/2017 |
| WO | WO 2017/159377 A1 | 9/2017 |

OTHER PUBLICATIONS

International Search Report and Written Opinion dated Apr. 22, 2019 in International Application No. PCT/US2018/064982, 13 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on $SiO_2$—$SiO_2$ bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

Plobi, A. et al., "Wafer direct bonding: tailoring adhesion between brittle materials," Materials Science and Engineering Review Journal, 1999, R25, 88 pages.

Amirfeiz et al., "Formation of silicon structures by plasma-activated wafer bonding," Journal of The Electrochemical Society, 2000, vol. 147, No. 7, pp. 2693-2698.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and $SiO_2$," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

International Search Report and Written Opinion dated May 29, 2017, issued in International Application No. PCT/US2016/067182, 14 pages.

(56) References Cited

OTHER PUBLICATIONS

International Search Report and Written Opinion dated Jan. 9, 2018, issued in International Application No. PCT/US2017/052409, 16 pages.
International Search Report and Written Opinion dated Mar. 22, 2018, issued in International Application No. PCT/US2017/064735, 13 pages.
International Search Report and Written Opinion dated Apr. 23, 2018, issued in International Application No. PCT/US2017/068788, 13 pages.
International Search Report and Written Opinion dated Jul. 17, 2018, issued in International Application No. PCT/US2018/025241, 15 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confereerence, 2001, 51st Proceedings, IEEE, pp. 384-387.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

(56) References Cited

OTHER PUBLICATIONS

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Kalnitsky, Alexander et al., "High Density Capacitor for Power Management Applications and its Integration in the SiP," Taiwan Semiconductor Manufacturing Company, Hsin-Chu, Taiwan, 2014, TSMC, Ltd., 16 slides.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the BUSH article share the part number "Onsemi AR0820."

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

\* cited by examiner

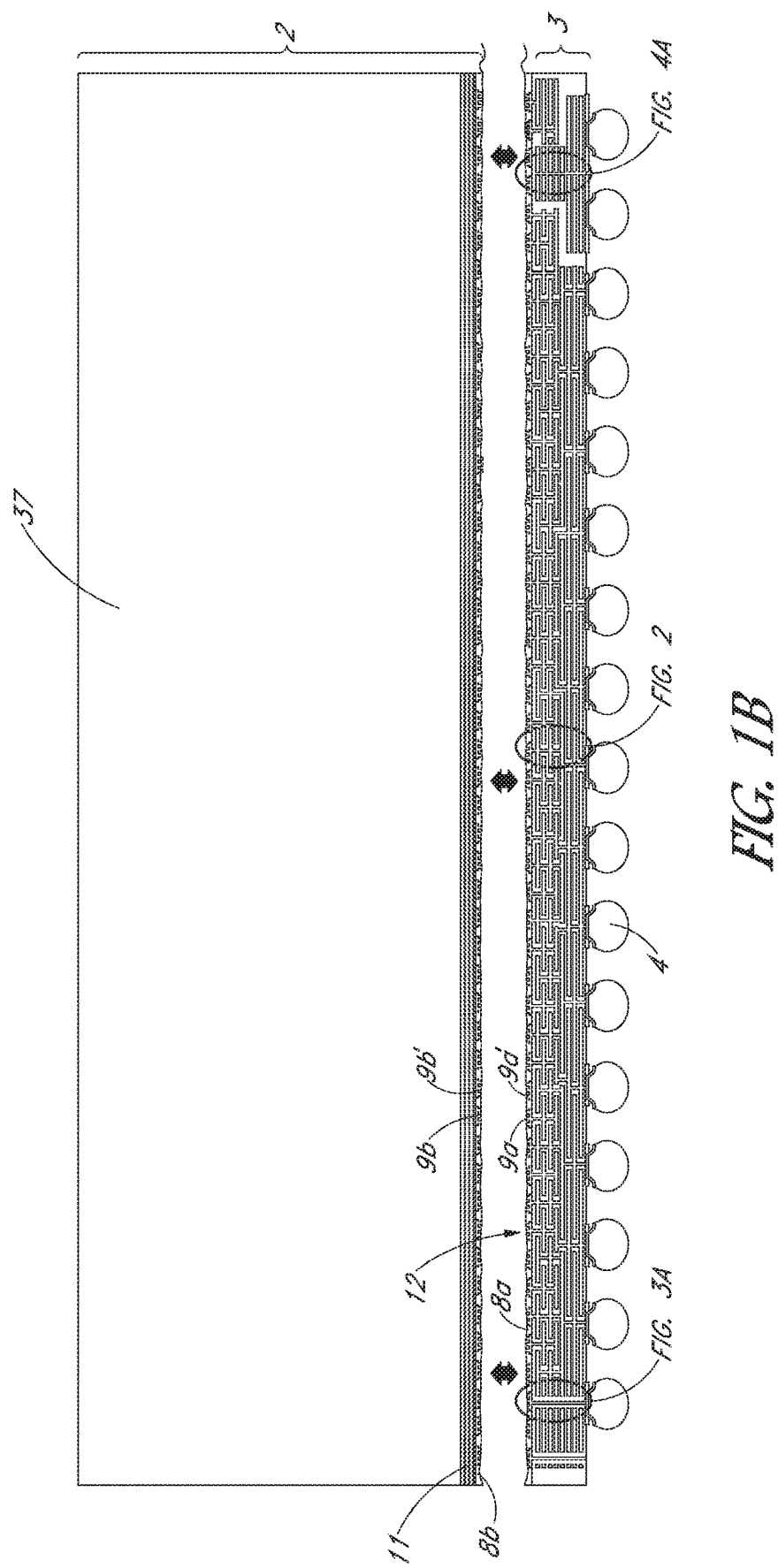

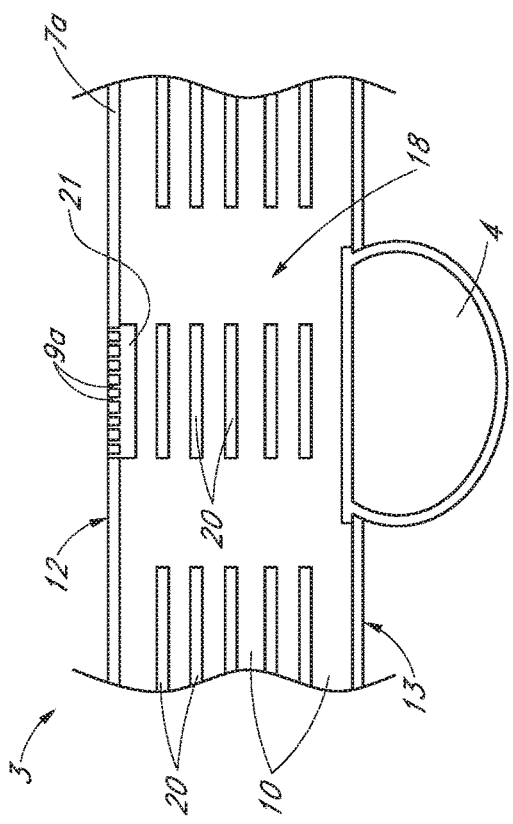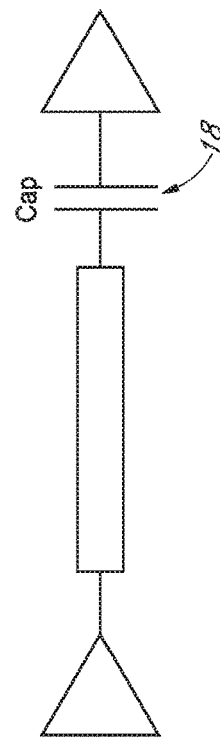
FIG. 4A
FIG. 4B
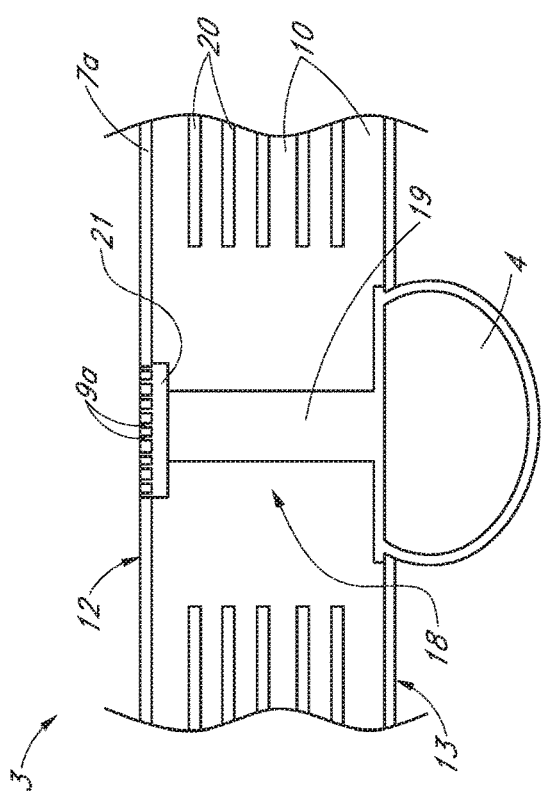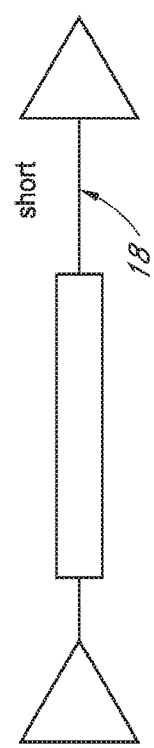
FIG. 3A
FIG. 3B

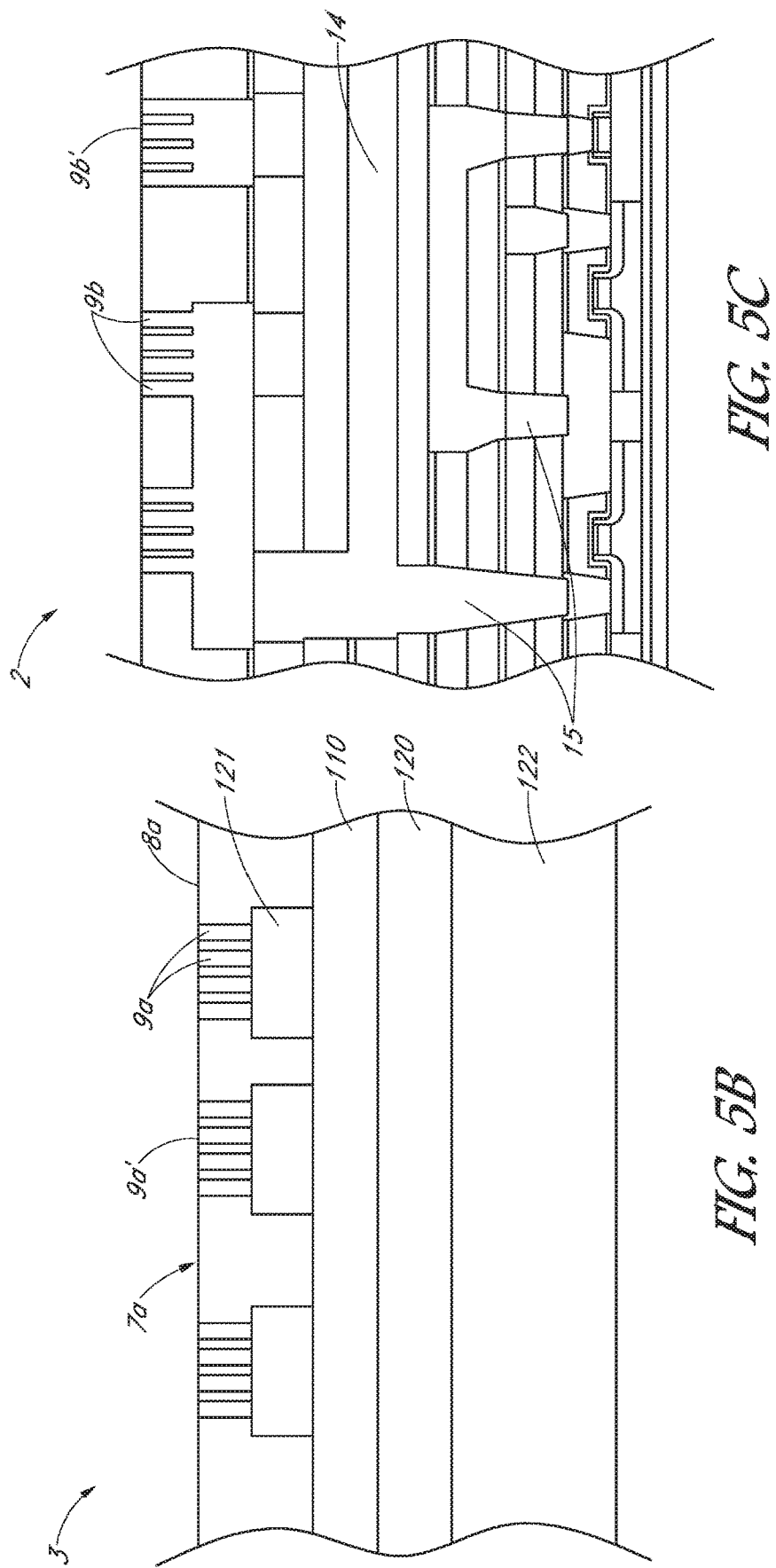

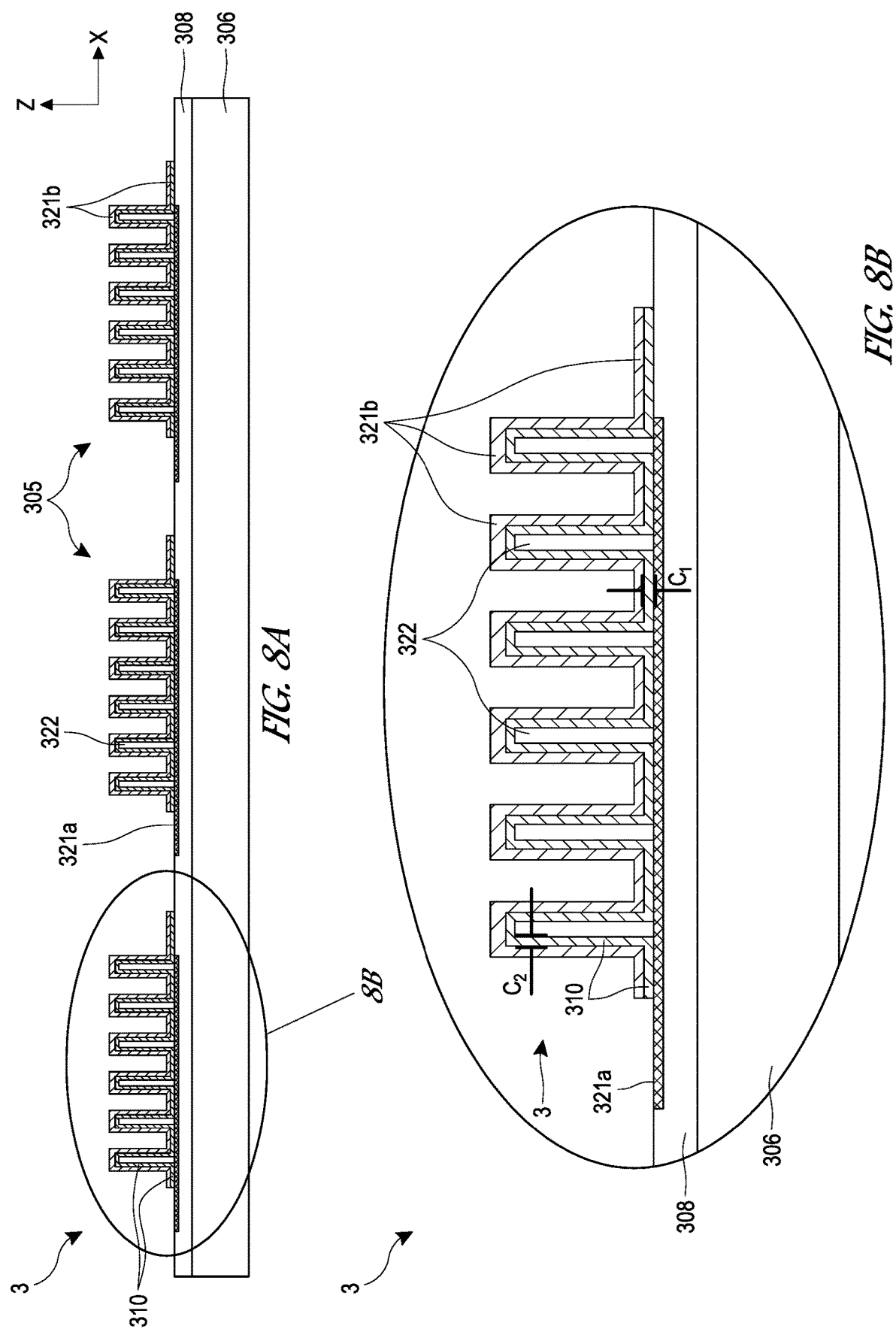

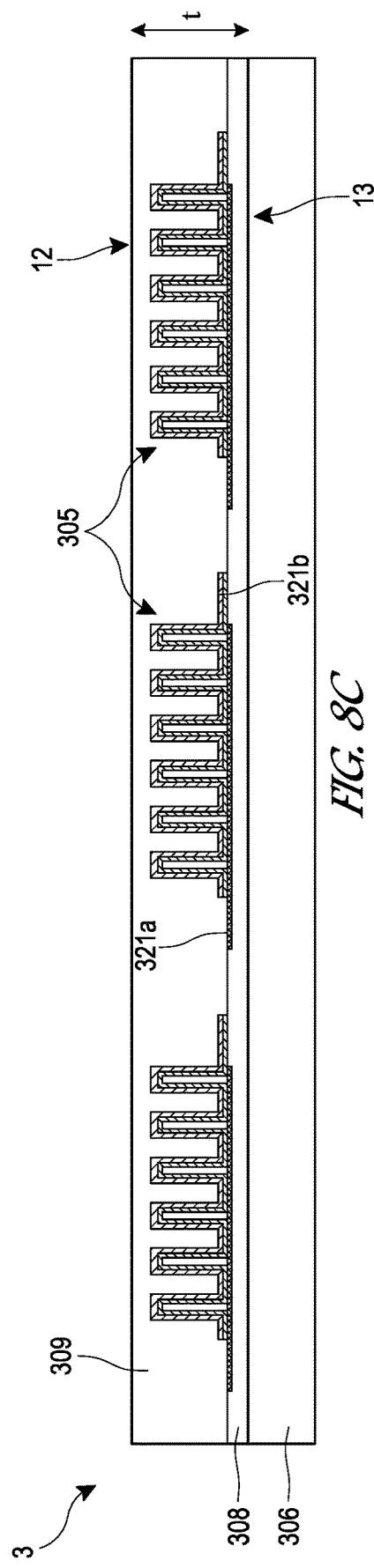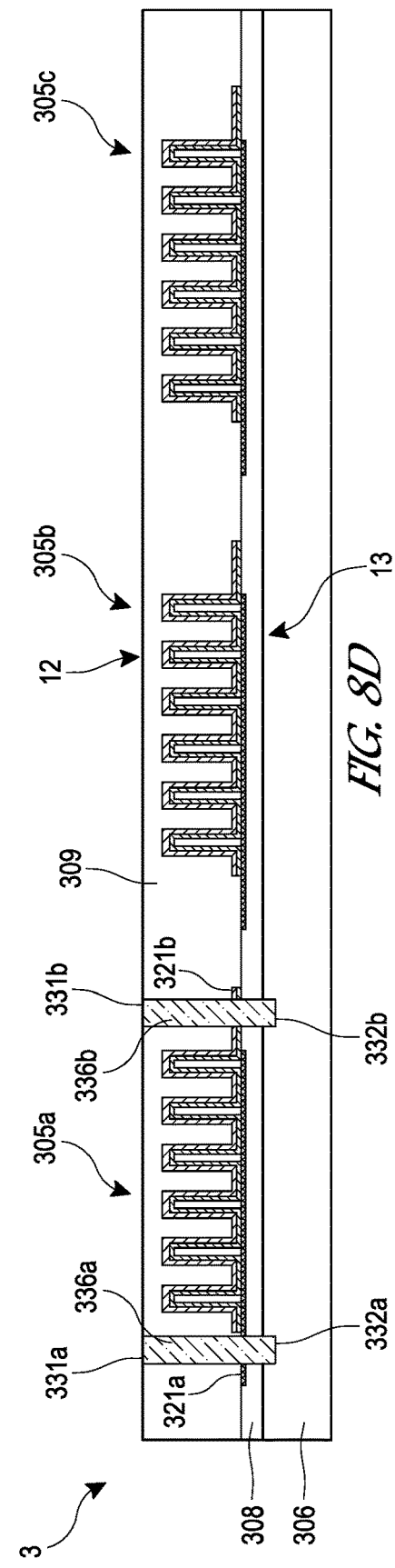

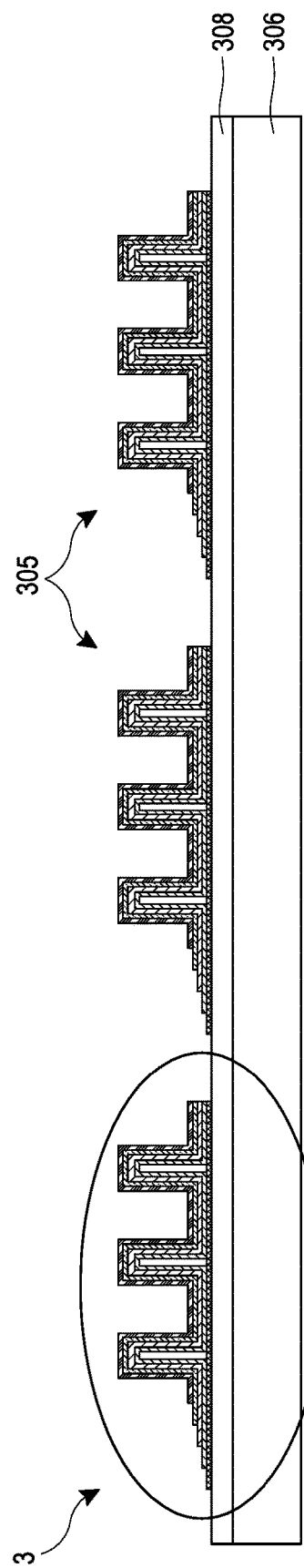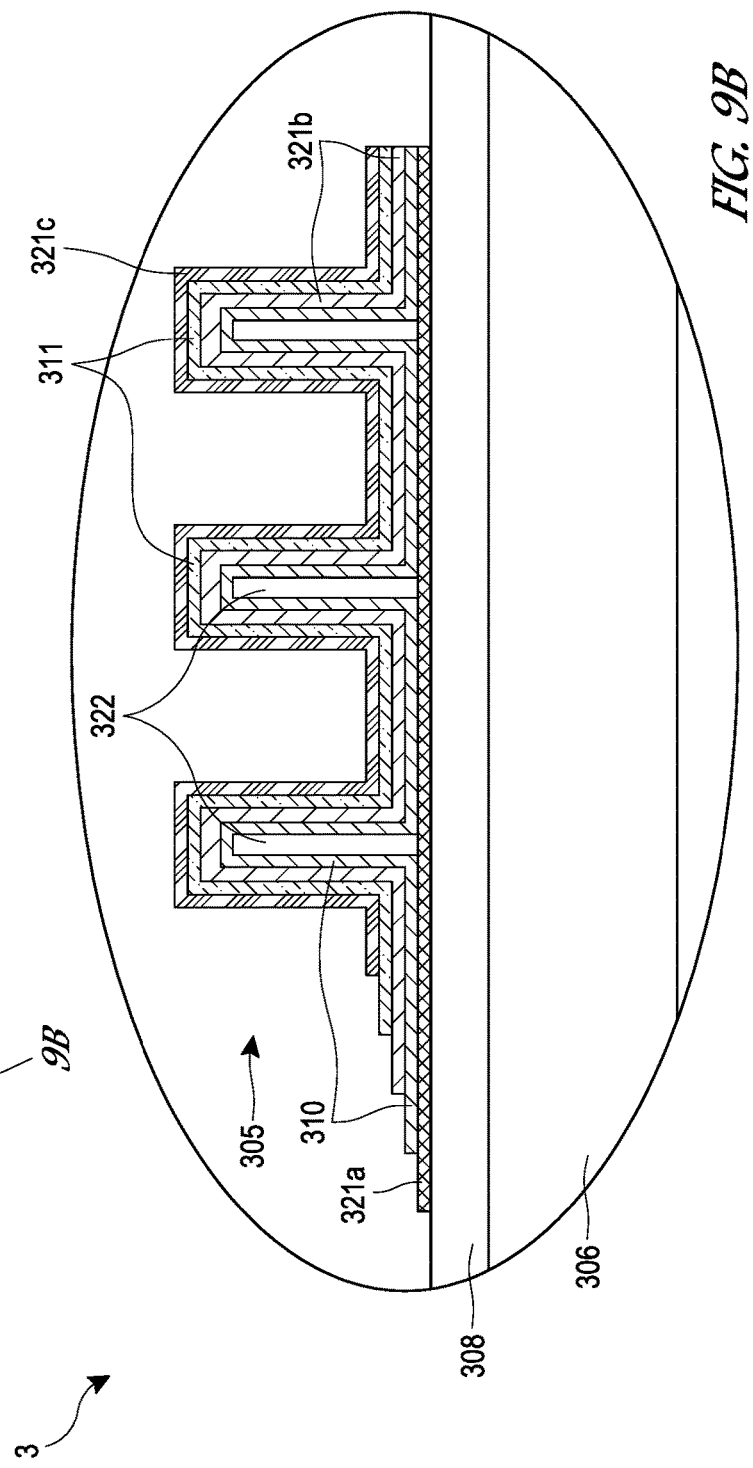

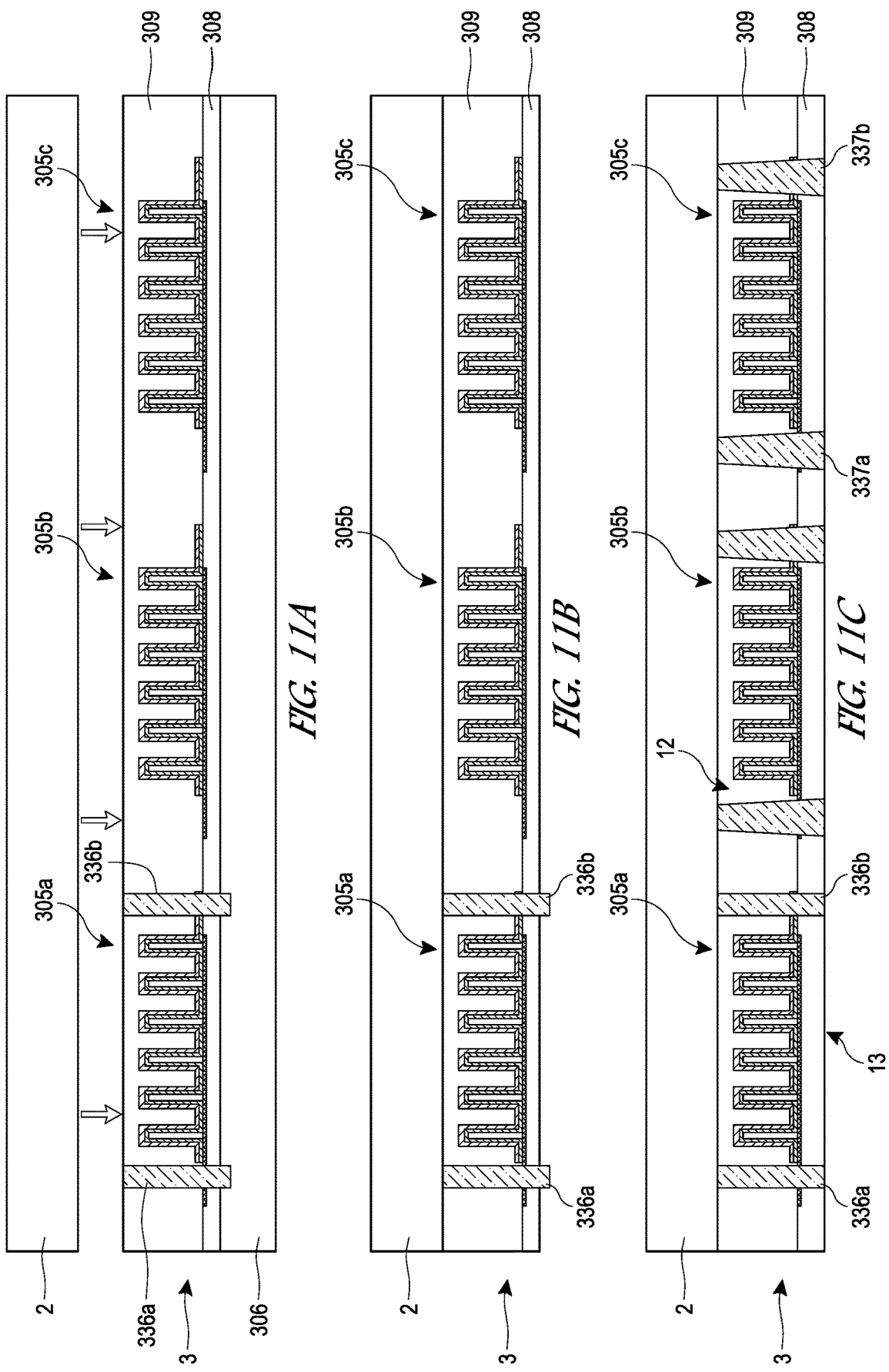

ved by reference herein in its entirety and for all purposes. This application is also related to U.S. Patent Publication No. US 2018/0190583, the content of which is incorporated by reference herein in its entirety and for all purposes.

BONDED STRUCTURES WITH INTEGRATED PASSIVE COMPONENT

CROSS-REFERENCE TO RELATED APPLICATIONS

This application is related to U.S. Patent Publication No. US 2018/0190580, filed Dec. 28, 2017, the content of which is incorporated by reference herein in its entirety and for all purposes. This application is also related to U.S. Patent Publication No. US 2018/0190583, the content of which is incorporated by reference herein in its entirety and for all purposes.

BACKGROUND

Field

The field relates to bonded structures with integrated passive components, and in particular to passive components defined at least in part by a plurality of elongate fibers.

Description of the Related Art

Passive electronic components, such as capacitors, resistors, and inductors, play important roles in electronic systems. For example, passive components help smooth signals and increase the performance of active devices of the system. Incorporating passive components in an efficient manner may be challenging, since the passive components occupy valuable space on the integrated device die, the package, and/or the system board. Accordingly, there remains a continuing need for improved incorporation of passive electronic components into electronic systems.

BRIEF DESCRIPTION OF THE DRAWINGS

FIG. 1B is a schematic side view of an element and a passive electronic component prior to forming a bonded structure.

FIG. 3A is a schematic side sectional view of a portion of a passive electronic component configured for relatively low speed connections.

FIG. 3B is a schematic circuit diagram of the passive electronic component of FIG. 3A.

FIG. 4A is a schematic side sectional view of a portion of a passive electronic component configured for relatively high speed connections.

FIG. 4B is a schematic circuit diagram of the passive electronic component of FIG. 4A.

FIG. 5B is a schematic side sectional view of the passive electronic component of FIG. 5A, with a bonding layer provided over a patterned electrode.

FIG. 5C is a schematic side sectional view of a portion of the semiconductor element prior to bonding.

FIG. 8A is a schematic side sectional view of a partially-fabricated passive electronic component, according to another embodiment.

FIG. 8B is an enlarged side sectional view of FIG. 8A illustrating a capacitor of the passive electronic component.

FIG. 8C is a schematic side sectional view of the partially-fabricated passive electronic component of FIG. 8A with capacitors embedded in an insulating layer.

FIG. 8D is a schematic side sectional view of the partially-fabricated passive electronic component of FIG. 8C, illustrating the use of vias for electrically connecting to one of the capacitors.

FIG. 9A is a schematic side sectional view of a partially-fabricated passive electronic component including capacitors with more than two electrodes, according to another embodiment.

FIG. 9B is an enlarged side sectional view of FIG. 9A illustrating a capacitor of the passive electronic component.

FIG. 11A is a schematic side sectional view of a passive electronic component and an element prior to bonding.

FIG. 11B is a schematic side sectional view of the passive electronic component and element of FIG. 11A after bonding.

FIG. 11C is a schematic side sectional view of the bonded structure of FIG. 11B in which some conductive vias are formed after bonding.

DETAILED DESCRIPTION

Figure 1A:
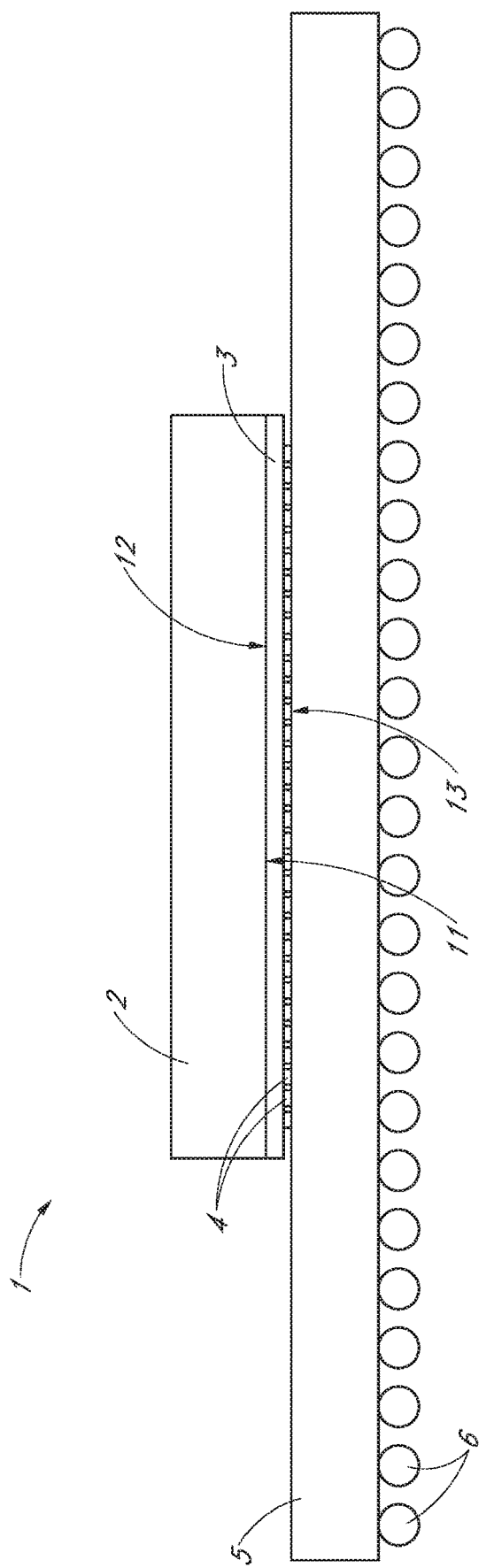
FIG. 1A is a schematic side view of a bonded structure mounted to a carrier such as a package substrate, according to various embodiments.

Various embodiments disclosed herein related to a bonded structure comprising a semiconductor element and a passive electronic component directly bonded to the semiconductor element without an intervening adhesive. In various embodiments, the passive electronic component comprises a capacitor. In other embodiments, the passive electronic component can comprise other devices, such as an inductor, a resistor, a voltage regulator, a filter, and/or a resonator. Beneficially, the passive electronic component can be integrated into a layer of passive components that is directly bonded to the semiconductor element (such as an integrated device die). In the illustrated embodiments, for example, the layer of passive components can be disposed between the semiconductor element and another system component such as an interposer, system substrate, etc. The passive electronic component described herein can thereby reduce the space occupied by passive components at the integrated device, at the package, and/or at the system board. Moreover, positioning the passive electronic component closer to active components of the semiconductor element can beneficially reduce overall inductance, which can improve the bandwidth and signal integrity of the semiconductor element, as compared with passive devices that are mounted to the package substrate or system board. In addition, the overall capacitance provided by the disclosed embodiments enables significantly higher capacitances (and reduced inductance) as compared with discrete passives mounted to a die.

In various embodiments, the passive component can comprise a layered capacitor structure with a massive capacitance. In some embodiments, for example, high dielectric constant (high K) wafer or sheets can be created with layered capacitors. A wafer-to-wafer bonding layer can be provided on a first element, such as a first semiconductor element or wafer (e.g., a processor wafer comprising a plurality of processors), and a second element, such as a second semiconductor element or wafer (e.g., a capacitor wafer that defines one or a plurality of capacitors). The first and second elements disclosed herein can comprise semiconductor elements that are formed of a semiconductor material, or can comprise other non-semiconductor elements, such as various types of optical devices (e.g., lenses, filters, waveguides, etc.). In various embodiments, an additional direct bonding layer can be added and prepared for direct bonding to both the capacitor wafer and the processor wafer. The layered capacitor structures disclosed herein may be used as alternating current (AC) coupling capacitors connected in series to a signal path to filter out direct current (DC) components of signals for balanced high-speed signaling. The layered capacitor structure may also be used as a decoupling capacitor with high capacitance and extremely low parasitic inductance and resistance for reducing system power delivery network (PDN) impedance. Results show the capacitor structure enables operation for all frequency ranges with PDN impedance reduced by more than 1000 times compared with the use of discrete capacitors mounted to the die or package substrate.

The direct bond between the semiconductor element and the passive component can include a direct bond between corresponding conductive features of the semiconductor element (e.g., a processor die or wafer) and the passive component (e.g., a bond pad of the semiconductor element and a corresponding contact pad of the passive component) without an intervening adhesive, without being limited thereto. In some embodiments, the conductive features may be surrounded by non-conductive field regions. To accomplish the direct bonding, in some embodiments, respective bonding surfaces of the conductive features and the non-conductive field regions can be prepared for bonding. Preparation can include provision of a nonconductive layer, such as silicon oxide, with exposed conductive features, such as metal bond pads or contacts. The bonding surfaces of the conductive features and non-conductive field regions can be polished to a very high degree of smoothness (e.g., less than 20 nm surface roughness, or more particularly, less than 5 nm surface roughness). In some embodiments, the surfaces to be bonded may be terminated with a suitable species and activated prior to bonding. For example, in some embodiments, the non-conductive surfaces (e.g., field regions) of the bonding layer to be bonded, such as silicon oxide material, may be very slightly etched for activation and exposed to a nitrogen-containing solution and terminated with a nitrogen-containing species. As one example, the surfaces to be bonded (e.g., field regions) may be exposed to an ammonia dip after a very slight etch, and/or a nitrogen-containing plasma (with or without a separate etch). In a direct bond interconnect (DBI) process, nonconductive features of the die and the passive component layer can directly bond to one another, even at room temperature and without the application of external pressure, while the conductive features of the die and the passive component layer can also directly bond to one another, without any intervening adhesive layers. Bonding by DBI forms stronger bonds than Van der Waals bonding, including significant covalent bonding between the surfaces of interest.

In some embodiments, the respective conductive features can be flush with the exterior surfaces (e.g., the field regions) of the semiconductor element and the passive component. In other embodiments, the conductive features may extend above the exterior surfaces. In still other embodiments, the conductive features of one or both of the semiconductor element and the passive component layer are recessed relative to the exterior surfaces (e.g., nonconductive field regions) of the semiconductor element and the passive component. For example, the conductive features can be recessed relative to the field regions by less than 20 nm, e.g., less than 10 nm.

Once the respective surfaces are prepared, the nonconductive field regions (such as silicon oxide) of the semiconductor element can be brought into contact with corresponding nonconductive regions of the passive component. The interaction of the activated surfaces can cause the nonconductive regions of the semiconductor element to directly bond with the corresponding nonconductive regions of the passive component without an intervening adhesive, without application of external pressure, without application of voltage, and at room temperature. In various embodiments, the bonding forces of the nonconductive regions can include covalent bonds that are greater than Van der Waals bonds and exert significant forces between the conductive features. Prior to any heat treatment, the bonding energy of the dielectric-dielectric surface can be in a range from 150-300 $mJ/m^2$, which can increase to 1500-4000 $mJ/m^2$ after a period of heat treatment. Regardless of whether the conductive features are flush with the nonconductive regions or recessed, direct bonding of the nonconductive regions can facilitate direct metal-to-metal bonding between the conductive features. In various embodiments, the semiconductor element and the passive component may be heated after bonding at least the nonconductive regions. As noted above, such heat treatment can strengthen the bonds between the nonconductive regions, between the conductive features, and/or between opposing conductive and non-conductive regions. In embodiments where one or both of the conductive features are recessed, there may be an initial gap between the conductive features of the semiconductor element and the passive component layer, and heating after initially bonding the nonconductive regions can expand the conductive elements to close the gap. Regardless of whether there was an initial gap, heating can generate or increase pressure between the conductive elements of the opposing parts, aid bonding of the conductive features and form a direct electrical and mechanical connection.

In some embodiments, the capacitance can be improved by providing capacitors that have electrode surfaces generally disposed along a direction non-parallel to (e.g., generally perpendicular to) a major lateral surface of the element (e.g., a semiconductor element). The undulations that provide the increased surfaces can be relatively simply patterned, compared to multiple layers and masks for producing laterally extending fins. The capacitor can comprise first and second electrodes that include major surfaces extending along the non-parallel direction and spaced apart by an intervening dielectric. The vertically-disposed undulations (e.g., trenches) of the capacitor can have a high aspect ratio, e.g., a first height of the first electrode along the non-parallel direction can be longer than a width of the capacitor along the major lateral surface. The aspect ratio, which can be defined by the first height divided by the width, can be greater than 5:1. In such embodiments, providing the capacitor primarily vertically relative to the semiconductor element can beneficially increase the overall surface area of the electrodes, improving capacitance relative to other arrangements.

Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. patent application Ser. Nos. 14/835,379; 62/278,354; 62/303,930; and 15/137,930, the contents of each of which are hereby incorporated by reference herein in their entirety and for all purposes.

FIG. 1A is a schematic side view of a bonded structure 1 mounted to a carrier such as a package substrate 5, according to various embodiments. The illustrated carrier comprises a package substrate, but in other embodiments, the carrier can comprise an integrated device die or any other suitable element. The package substrate 5 can comprise any suitable substrate configured to mount to a system motherboard. For example, in various embodiments, the package substrate 5 can comprise a printed circuit board (PCB), an interposer, a leadframe, a ceramic substrate, a polymer substrate, or any other suitable carrier. As shown in FIG. 1A, the package substrate 5 can comprise a plurality of solder balls 6 to provide electrical connection with the system motherboard (not shown). In other embodiments, the package substrate 5 can electrically connect to the system motherboard in other ways.

In FIG. 1A, the bonded structure 1 comprises an element (e.g., a semiconductor element 2) and a passive electronic component 3 directly electrically and mechanically connected with the element 2. The element 2 illustrated in FIG. 1A comprises a semiconductor element such as a processor die, but other types of integrated device dies or semiconductor elements can be used. For example, in other embodiments, the element 2 can comprise a memory die, a microelectromechanical systems (MEMS) die, an optical device or die, an interposer, a reconstituted die or wafer, or any other suitable device or element. In various embodiments, the element 2 illustrated herein can instead comprise a non-semiconductor element such that the passive electronic component 3 can be mechanically and electrically connected to other types of elements, such as optical elements (e.g., optical lenses, waveguides, filters, etc.), which may or may not comprise a semiconductor material.

As explained herein, in various applications (such as high speed communications or power dies), it can be important to provide passive electronic components (such as a capacitor) near the active circuitry of the semiconductor element 2 in order to reduce the overall impedance and/or inductance, which can accordingly improve the signal integrity and reduce switching noise. Thus, as shown in FIG. 1A, the passive electronic component 3 can be bonded to an active surface 11 of the semiconductor element 2, i.e., active electronic circuitry can be defined at or near the active surface 11 of the semiconductor element 2. In the illustrated embodiment, the passive electronic component 3 is directly bonded to the active surface 11 of the semiconductor element 2 without an intervening adhesive. In other embodiments, however, the passive electronic component 3 can be adhered to the semiconductor element 2, e.g., by way of a microbump array with reflow, conductive pillars, or by a thermocompression bond. Beneficially, bonding the passive electronic component 3 to the front or active surface 11 of the semiconductor element 2 can reduce the length of the signal lines and the overall impedance and/or inductance, as compared with systems which mount passive devices at the system board or package substrate. The passive component 3 can reduce the voltage requirements for the semiconductor element 2 by acting to quiet the noisy components therein. Moreover, bonding the passive electronic component 3 to the semiconductor element 2 can reduce the overall dimensions of the package, since the passives occupy a thin layer bonded to the semiconductor element 2. The skilled artisan will appreciate, however, direct bonding of passive electronic components between a carrier and a semiconductor element, for example, by way of through silicon vias (TSVs) on the back side thereof.

As shown in FIG. 1A, the passive electronic component 3 can comprise a first surface 12 directly bonded to the semiconductor element 2 and a second exterior surface 13 opposite the first surface 12 of the passive electronic component 3. A plurality of electrical contacts 4 (e.g., solder balls) can be provided on the second exterior surface 13 of the passive electronic component 3. The plurality of electrical contacts 4 can be configured to electrically connect to an external semiconductor element, such as the package substrate 5 shown in FIG. 1A (e.g., a printed circuit board, an interposer, etc.). Alternatively, the second surfaces 13 can have exposed contacts or pads that are configured for direct bond connection to another element that serves as a carrier for the bonded structure, such as another semiconductor element (e.g., die or interposer).

As shown in FIG. 1A, the passive electronic component 3 can cover (e.g., can be disposed over) a majority of the active surface 11 of the semiconductor element 2, e.g., a majority of the surface of the semiconductor element 2 that is used for processing or other active tasks. For example, in various embodiments, the passive electronic component 3 can cover at least 55%, at least 65%, at least 75%, at least 85%, at least 95%, at least 99%, or at least 100% of the active surface 11 of the semiconductor element 2. In FIG. 1A, a single unitary passive component 3 is shown as covering substantially the entire active surface 11 of the semiconductor element 2; however, in other embodiments, the passive component 3 can comprise a plurality of discrete or separate passive components that are bonded to cover a majority of the active surface 11 of the element 2. In addition, in other embodiments, the passive electronic component 3 may be mechanically and electrically connected to the back side of the semiconductor element 2, i.e., the surface opposite the active surface 11. In such arrangements, the length of conductors within the element 2 may be sufficiently short so as to sufficiently reduce impedance relative to routing to separate surface mounted passives on a packaging substrate, even though the passive component 3 is mounted to the back side of the element 2. Moreover, as shown in FIG. 1A, the passive electronic component 3 can comprise a sheet that is bonded (e.g., directly bonded without an intervening adhesive) to the semiconductor element 2, i.e., the passive electronic component 3 can be dimensioned so as to have a lateral width that is significantly larger than its thickness. For example, the passive electronic component 3 can have a lateral width (e.g., as defined along a direction parallel to the active surface 11 of the element 2) that is at least 3 times, at least 5 times, at least 10 times, or at least 50 times its thickness (e.g., as defined along a direction perpendicular to the active surface 11 of the element 2) of the component 3.

The passive electronic component 3 can be provided on a sacrificial wafer (e.g., silicon or glass), and the semiconductor element 2 can also be provided on a wafer. The two wafers can be directly bonded to one another at the wafer level (e.g.,wafer-to-wafer or W2W), such that a plurality of passive components 3 can be bonded to a corresponding plurality of semiconductor elements 2, which can improve manufacturing throughput. After bonding, the base material of the wafers can be thinned or removed prior to or after dicing. In other embodiments, the passive electronic component 3 can be picked and placed on the semiconductor element 2, or can be bonded to the semiconductor element 2 using other processing techniques.

FIG. 1B is a schematic side view of a semiconductor element 2 comprising a bulk material portion 37 (e.g., bulk semiconductor material) and active surface 11, and a passive electronic component 3 prior to forming a bonded structure 1. Unless otherwise noted, the features of FIG. 1B may be the same as or generally similar to like-numbered features of FIG. 1A. As explained above, the passive component 3 and the semiconductor element 2 can comprise respective bonding layers 8a, 8b (see also FIG. 2). In the illustrated embodiment, the bonding layer 8a of the passive electronic component 3 can comprise one or a plurality of conductive features 9a, 9a', such as metal, surrounded by non-conductive field regions (see FIG. 2), such as a form of silicon oxide material. Similarly, the bonding layer 8b can comprise one or a plurality of conductive features 9b, 9b', such as metal, surrounded by non-conductive field regions (see FIG. 2), such as silicon oxide. The conductive features 9a, 9a', 9b, 9b' can act as electrical interconnects to provide electrical communication between the semiconductor element 2 and the passive component 3. The conductive features 9a, 9a', 9b, 9b' can comprise any suitable metal or conductor, such as copper. As explained above, the conductive features 9a, 9a', 9b, 9b' can be recessed below, can protrude above, or can be flush with, exterior surfaces of the non-conductive field regions.

In the embodiment of FIG. 1B, the conductive feature 9a can comprise a first terminal (e.g., an anode of a capacitive device), and the other conductive feature 9a' can comprise a second terminal (e.g., a cathode of a capacitive device) that is of a different type than the first terminal. Similarly, the conductive feature 9b can comprise a first terminal of the element 2 (e.g., an anode), and the other conductive feature 9a' can comprise a second terminal of the element 2 (e.g., a cathode) that is of a different type than the first terminal. Beneficially, various embodiments disclosed herein can include both the anode and the cathode (e.g., conductive features 9a, 9a') on the same first surface 12 of the passive electronic component 3. Thus, respective anode terminals 9b of the semiconductor element 2 can bond and electrically connect to corresponding respective anode terminals 9a of the passive electronic component 3 disposed on the first surface 12. Respective cathode terminals 9b' of the semiconductor element 2 can bond and electrically connect to corresponding respective cathode terminals 9a' of the passive electronic component 3 disposed on the first surface 12.

Advantageously, providing the anode terminal 9a and the cathode terminal 9a' on the same first surface 12 of the passive electronic component 3 can enable wafer level bonding of two structures along the same side of the passive component 3 (e.g., bonding of the semiconductor element 2 and the passive component 3). Thus, in the embodiments, disclosed herein, each opposing side of the passive component 3 can comprise one or a plurality of anodes and one or a plurality of cathodes (e.g., terminals of different types). In various embodiments, one or both sides of the component 3 can comprise one or more dummy terminals. An element (such as semiconductor element 2) can have contacts connected (e.g., bonded) to corresponding anode and cathode terminals on one side (e.g., a first side) of the passive component. A second element (such as another semiconductor element, a package substrate, etc.) can have contacts connected (e.g., bonded) to corresponding second anode and cathode terminal on the opposite side (e.g., a second side) of the passive component 3. In the illustrated embodiment of FIG. 1B, for example, the element 2 can connect to corresponding first and second terminals which are of a different type (e.g., anode and cathode terminals) on a first side of the passive component 3. Another element (not shown) such as a package substrate can connect to corresponding first and second terminals which are of a different type (e.g., anode and cathode terminals) on the second opposite side of the passive component 3, for example, by way of the interconnects 4 (which may comprise solder balls).

In various embodiments, the anode terminals 9a, 9b are directly bonded to one another without an intervening adhesive. Similarly, the cathode terminals 9a', 9b' can also be directly bonded to one another without an intervening adhesive. In various embodiments, the respective anode terminals 9a, 9b and cathode terminals 9a', 9b' can be connected by way of thermocompression bonding. In other embodiments, the respective anode terminals 9a, 9b and cathode terminals 9a', 9b' can be connected in other ways, e.g., by way of a conductive adhesive, such as solder, anisotropic conductive film, etc. Furthermore, as shown in FIG. 1B, various portions of the passive component 3 can have different types of interconnects and/or passive components. For example, one portion of the passive electronic component 3 can comprise a multilayer capacitive portion, similar to the portion illustrated in FIG. 2, and another portion of the passive electronic component 3 can comprise a series capacitive interconnect similar to what is shown in FIG. 4A. In still other portions of the passive electronic component, a low resistance electrical pathway (e.g., a through interconnect), such as that shown in FIG. 3A, may be provided. Moreover, passive electronic components such as those shown in FIGS. 7A-7C may also include anode and cathode terminals 9a, 9a' on the same side of the component.

Figure 2:
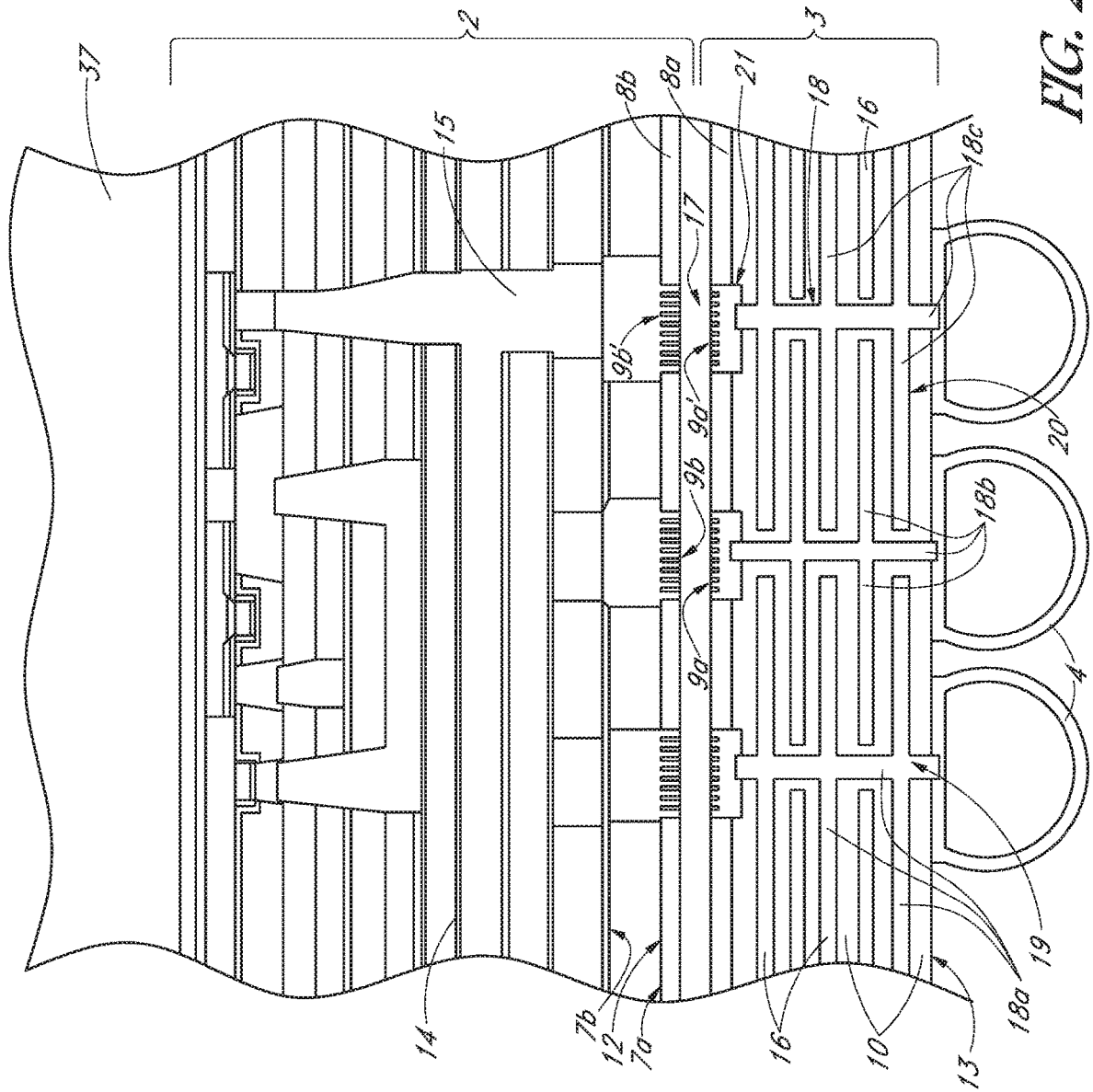
FIG. 2 is a schematic, magnified side cross-sectional view of portions of the bonded structure shown in FIG. 1A.

FIG. 2 is a schematic, magnified side cross-sectional view of portions of the semiconductor element 2 and the passive electronic component 3 shown in FIGS. 1A-1B, just prior to direct bonding. As explained above, the passive component 3 can comprise a bonding layer 8a, and the semiconductor element 2 can comprise a bonding layer 8b. In the illustrated embodiment, the bonding layer 8a can comprise one or a plurality of conductive features 9a, 9a', such as metal, surrounded by non-conductive field regions 7a, such as a form of silicon oxide material. Similarly, the bonding layer 8b can comprise one or a plurality of conductive features 9b, 9b', such as metal, surrounded by non-conductive field regions 7b, such as silicon oxide. The conductive features 9a, 9a', 9b, 9b' can act as electrical interconnects to provide electrical communication between the semiconductor element 2 and the passive component 3. The conductive features 9a, 9a', 9b, 9b' can comprise any suitable metal or conductor, such as copper. As explained above, the conductive features 9a, 9a', 9b, 9b' can be recessed below, can protrude above, or can be flush with, exterior surfaces of the non-conductive field regions 7a, 7b. The non-conductive field regions 7a, 7b can comprise any suitable non-conductive material, such as silicon oxide, undoped or very lightly doped silicon, silicon nitride, etc., that can be prepared for direct bonding.

As explained above, the bonding layers 8a, 8b can be polished (e.g., by chemical mechanical polishing, or CMP) to a very low surface roughness (e.g., RMS roughness less than 20 nm, or more particularly, less than 5 nm). As explained above, the bonding layers 8a, 8b (e.g., the non-conductive field regions 7a, 7b) can be activated and terminated with a suitable species, such as nitrogen, e.g., by way of exposure to a nitrogen-containing plasma (e.g., in a reactive ion etch) or by very slightly etching and subsequently exposing to a nitrogen-containing (e.g., ammonia) solution. The bonding layers 8a, 8b can be brought together at room temperature in some embodiments to form a direct bond between the field regions 7a, 7b. The semiconductor element 2 and the passive component 3 can be heated to strengthen the bond between the field regions 7a, 7b, and/or to cause the conductive features 9a and 9b, and 9a' and 9b' to expand and form an electrical connection. Beneficially, the use of a direct bond can provide a low impedance and low inductance electrical pathway between the semiconductor element 2 and the passive component 3, which can improve power or signal integrity.

As shown in FIG. 2, the semiconductor element 2 can comprise internal conductive traces 14 and vias 15 to route electrical signals within the semiconductor element 2 and/or between the semiconductor element 2 and the passive electronic component 3. The electrical signals can pass through the conductive features 9a, 9a' and 9b, 9b' (which may be directly bonded to one another, respectively) to and/or from the passive electronic component 3. The conductive features 9a, 9a' can define, can act as, or can connect to a contact pad 21 at or near the first surface 12 of the passive electronic component 3. As shown in FIG. 2, in various embodiments, the passive electronic component 3 can comprise a plurality of (e.g., two or more, or three or more) conductive layers 16 spaced apart by one or a plurality of dielectric or nonconductive layers 10. As show in FIG. 2, the bonded structure 1 can include conductive features 9a, 9a', 9b, 9b' that define an interconnect structure 17 that includes the contact pads 21 and electrical pathways or interconnects 18 between the semiconductor element 2 and the electrical contacts 4 on the second surface 13 of the passive electronic component 3. In FIG. 2, a plurality of conductive features 9a, 9a', 9b, 9b' are shown on each of the bonding layers 8a, 8b, which may reduce dishing. However, in other embodiments, the contact pads 21 may be defined sufficiently small so as to avoid the effects of dishing during processing. In such arrangements, each contact pad 21 can comprise one conductive feature.

Although FIG. 2 illustrates three contact pads 21 and three interconnects 4, in various embodiments, the number of contact pads 21 and interconnects 4 may differ. For example, in some embodiments, the pitch of the contact pads 21 on the semiconductor element 2 and/or passive component 3 may be smaller than the pitch of the interconnects 4. In various implementations, for example, the pitch of the interconnects 4 may be significantly greater than the pitch of the contact pads 21, e.g., the pitch of the interconnects 4 may be at least 10 times, at least 20 times, at least 30 times the pitch of the contact pads 21. As an example, the pitch of the interconnects 4 can be in a range of 100 microns to 300 microns, or in a range of 100 microns to 200 microns (e.g., about 150 microns). The pitch of the contact pads 21 can be in a range of 0.5 microns to 50 microns, in a range of 0.5 microns to 20 microns, or in a range of 1 micron to 10 microns (e.g., about 5 microns).

In some embodiments, a first conductive interconnect 18a extends from the first surface 12 (or the contact pad 21) to a corresponding electrical contact 4 at the second surface 13 of the passive electronic component 3. Second and third conductive interconnects 18b, 18c can also extend from the contact pad 21 to corresponding electrical contacts 4 at the second surface 13. In FIG. 2, for example, each of the conductive electrical interconnects 18a-18c can comprise a longitudinal conductive portion 19 extending from a corresponding contact pad 21 at or near the first surface 12 to a corresponding electrical contact 4. As shown in FIG. 2, the longitudinal portions 19 can extend vertically through the thickness of the passive electronic component 3 (e.g., transverse to the active surface 11 of the semiconductor element 2). The conductive interconnects 18a-18c can include one or more lateral conductive portions 20 extending laterally outward from the longitudinal conductive portions 19. The longitudinal conductive portions 19 can define resistive electrical pathways, and the one or more lateral conductive portions 20 can define capacitive electrical pathways in parallel with the resistive electrical pathways. As shown in FIG. 2, the one or more lateral conductive portions 20 of the first interconnect 18a can be interleaved with the lateral portions 20 of the second interconnect 18b and can separated by the intervening dielectric layers 10. Similarly, the lateral conductive portions 20 of the second interconnect 18b can be interleaved with the lateral portions 20 of the third interconnect 18c and can separated by the intervening dielectric layers 10. The interleaving of the lateral portions 20 of the respective interconnects 18a-18c can define, at least in part, the respective capacitive electrical pathways, such that each lateral portion 20 acts as an electrode of a capacitor and the intervening dielectric layer 10 acts as the capacitor dielectric. In various embodiments, the dielectric layer 10 can comprise a high K dielectric layer, such as titanates, (BaxSr1-xTiO3, Bi4Ti3O12, PbZrxTi1-xO3), niobates (LiNbO3), and/or zirconates (BaZrO3, Ca7rO3 etc). In other embodiments, the dielectric layer 10 may comprise any suitable dielectric material, such as silicon oxide, silicon nitride, etc. In some embodiments, the dielectric layer can have a dielectric constant in a range of 1 to 1000. In some embodiments, the dielectric layer can have a dielectric constant in a range of 1 to 10. As explained above in connection with FIG. 1B, in the illustrated embodiment, the anode and cathode terminals of the passive component 3 may be disposed along the same side of the component 3.

In various embodiments, the first and third interconnect structures 18a, 18c can be configured to connect to a power source, and the second interconnect structure 18b can be configured to connect to electrical ground, or vice versa. The passive electronic component 3 of FIG. 2 can beneficially act as multi-layer decoupling capacitors in parallel connection between power and ground to reduce power delivery network (PDN) impedance so as to improve power integrity. Moreover, providing the decoupling capacitors (e.g., the capacitors defined by the interconnect structures 18a-18c) near the active surface 11 of the semiconductor element 2 (e.g., near switches of a processing die) can further improve the power integrity of the bonded structure 1. Decoupling capacitance (such as that provided by the disclosed embodiments) in the core region of the die can provide a stable power supply to the computation engines in electronic devices. Increasing this decoupling capacitance provides more stability in the voltage swings which reduces the amount of additional margins that are accommodated in timing analysis to account for voltage uncertainty. By contrast, adding decoupling capacitance in parallel plate structures offers relatively small capacitance values. Deep trench capacitors may provide higher capacitances but occupy a valuable footprint which may add area and cost to electronic devices.

FIG. 3A is a schematic side sectional view of a portion of a passive electronic component 3 configured for relatively low speed connections. FIG. 3B is a schematic circuit diagram of the passive electronic component 3 of FIG. 3A. As shown in FIG. 3A, the passive component 3 can comprise an electrical pathway 18 having a low resistance and low capacitance between the first and second surfaces 12, 13 of the passive component 3. For example, in FIG. 3A, the pathway 18 can include a longitudinal conductive portion 19 that directly connects the contact pad 21 and the electrical contact 4. The longitudinal conductive portion 19 acts to short the signal between the contact pad 21 and the contact 4. In addition, as shown in FIG. 3A, lateral conductive portions 20 can be disposed offset from the longitudinal conductive portion 19. The lateral conductive portions 20 can be spaced from one another along the thickness of the passive component 3 and can be separated by intervening dielectric layer(s) 10. The electrical pathway 18 defined in the passive component 3 of FIGS. 3A-3B may be suitable for relatively low speed connections, since the longitudinal conductive portion 19 shorts the connection between the contact pad 21 and the electrical contact 4.

FIG. 4A is a schematic side sectional view of a portion of a passive electronic component 3 configured for high speed series link signaling. FIG. 4B is a schematic circuit diagram of the passive electronic component 3 of FIG. 4A. In the series link, the passive electronic component 3 can act as a DC-blocking capacitor, which can serve various purposes. For example, the passive electronic component 3 can regulate the average DC-bias level (e.g., filtering out the DC component), can protect the transmitter/receiver from destructive overload events that can occur due to poor power-up sequencing, and/or can function as part of a circuit that detects when the lines are disconnected. In these applications, the DC-blocking capacitor does not distort the high frequency components of signals passing through it. In various embodiments, all high frequency components, except the DC component of a signal, can pass through without any distortion. Hence, a large capacitance value with low connection parasitic resistance and/or inductance can be provided. The embodiment of FIGS. 4A-4B can be beneficial for frequencies of at least 500 MHz, although in other embodiments, lower frequency ranges may be used in conjunction with the disclosed embodiments. As shown in FIG. 4A, the passive electronic component 3 can comprise an electrical pathway that includes a multi-layer capacitor disposed between the contact pad 21 and the electrical contact 4. Indeed, unlike the embodiment of FIG. 3A, in FIG. 4A, the pathway 18 between the contact pad 21 and the contact 4 is a capacitive electrical pathway defined by a plurality of lateral conductive portions 20 spaced apart by intervening dielectric layer(s) 10 through the thickness of the passive electronic component 3. The multiple layers shown in FIG. 4A can function electrically as multiple capacitors electrically connected in series. The effective capacitance provided by the pathway 18 of FIG. 4A can be in a range of 10 nF/mm$^2$ to 1 µF/mm$^2$. Beneficially, in the illustrated embodiment, the capacitor(s) defined along the electrical pathway 18 can filter out DC components of signals to provide balanced, high-speed signaling (e.g., the pathway 18 can act as a high pass filter). Moreover, positioning the passive component 3 closer to the active circuitry of the semiconductor element 2 can further improve the performance of the bonded structure 1 and can reduce reflection noises.

FIGS. 5A-5I illustrate another embodiment in which a passive electronic component 3 is bonded (e.g., directly bonded) to a semiconductor element 2. As explained above in connection with FIG. 1B, in FIGS. 5A-5I, the anode and cathode terminals of the passive electronic component 3 can be disposed along the same side or surface of the component 3. In various arrangements, the passive component 3 can comprise a high dielectric constant (a high K) thin film capacitor layer with integrated interconnects for direct bonding and integration with other components, such as a processor. For example, in the embodiments of FIGS. 5A-5I, the passive component 3 can comprise dielectric materials that have a dielectric constant greater than 5, greater than 10, greater than 20, or greater than 100. Such high K materials may be difficult to manufacture, and may be processed at high temperatures that may be unsuitable for exposing other types of devices (e.g., processor or other semiconductor manufacture), such that it is difficult to integrate such materials into a conventional semiconductor device. Accordingly, in the embodiments disclosed herein, the semiconductor element 2 can be manufactured in one facility (e.g., a complementary metal oxide semiconductor, or CMOS, facility), and the passive component 3 can be manufactured in another facility that can accommodate the processing parameters for the high K materials. The semiconductor element 2 and the passive component 3 can be provided with bonding layers and can be directly bonded so as to connect the semiconductor element 2 and the passive component 3. Thus, the embodiments disclosed herein can enable the separate manufacture and subsequent integration of thin film, high K dielectric materials with any suitable type of semiconductor or optical element.

Figure 5A:
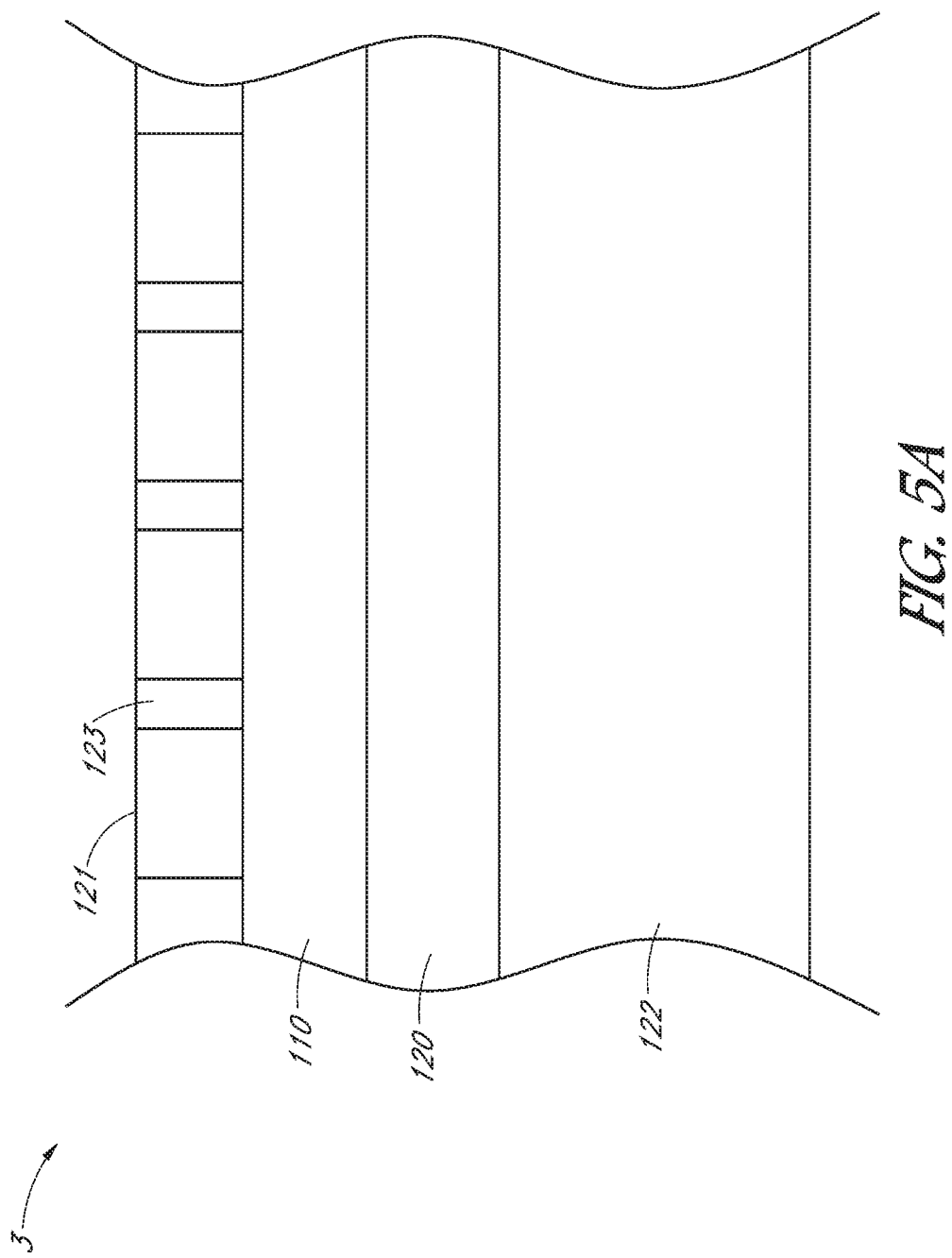
FIG. 5A is a schematic side sectional view of a passive electronic component that incorporates a high K dielectric material to define a capacitive sheet.

FIG. 5A is a schematic side sectional view of a passive electronic component 3 that incorporates a high K dielectric material to define a capacitive sheet. The passive electronic component 3 can comprise a base 122 upon which the capacitive sheet can be defined. The base 122 may be sacrificial, such that the base 122 can be removed prior to bonding the passive component 3 to the semiconductor element 2. In various embodiments, the base 122 can comprise a semiconductor material, such as silicon. A first electrode 120 can be formed on the base 122 in any suitable manner. For example, the first electrode 120 can be deposited on the base 122 using a metal organic chemical vapor deposition (MOCVD) process, a physical vapor deposition (PVD) or sputtering process, or a sol-gel process (spin on and cure). The first electrode 120 can comprise a refractory metal, such as platinum (Pt) or ruthenium (Ru). In the illustrated embodiment, the first electrode 120 can be deposited as a continuous or blanket film atop the base 122, and can serve as a common electrode for multiple capacitors.

A high K dielectric layer 110 can be deposited or otherwise formed on the first electrode 120. For example, in various embodiments, the dielectric layer 110 can be deposited using CVD, PVD, powder sintering, or other suitable techniques. Beneficially, the dielectric layer 110 can have a dielectric constant greater than 5, greater than 10, greater than 20, greater than 100, greater than 200 (e.g., about 300), or greater than 1000. In various embodiments, for example, the dielectric layer can comprise a complex oxide high K material, such as the ternary oxide barium strontium titanate ($BaSrTiO_3$ or BST), other titanates, ($Ba_xSr_{1-x}TiO_3$, $Bi_4Ti_3O_{12}$, $PbZr_xTi_{1-x}O_3$), niobates ($LiNbO_3$), and/or zirconates ($BaZrO_3$, $CaZrO_3$ etc). Unlike the embodiment of FIGS. 2-4B, therefore, only a single thin dielectric layer (rather than alternating multiple layers with conductors) may be used with the passive component 3. In some embodiments, multiple layers of dielectric material may be provided to form the dielectric layer 110.

A second electrode 121 can be deposited on the dielectric layer 110. The second electrode 121 can be any suitable conductive material, such as a refractory metal, and particularly a noble metal (e.g., Pt or Ru). The refractory or noble metals of one or both of the first electrode 120 and the second electrode 121 (e.g., Pt) can beneficially form a Schottky barrier (as opposed to ohmic contact) which can improve the performance of the capacitor. In the illustrated embodiment, therefore, the refractory or noble metals of the electrodes 120, 121 can remain in the final bonded structure 1 to provide improved performance. In some embodiments, the noble or refractory metal of the first and/or second electrodes 120, 121 can be plated with another metal (e.g., copper) to reduce resistance. In other embodiments, however, the first and/or second electrodes 120, 121 may be removed after formation of the passive component 3 and replaced with another metal (e.g., copper) to serve as the first and second electrodes 120, 121.

The second electrode 121 can be patterned to define a number of gaps 123 between portions of the second electrode 121. Patterning the electrode into a plurality of portions can define the overall capacitance provided by passive electronic component 3. For example, larger portions of the second electrode 121 may provide increased area and increased capacitance, while smaller portions of the second electrode 121 may provide reduced area and reduced capacitance. In various embodiments, the passive component 3 can comprise an array of capacitive cells, with a cell being similar to that illustrated in FIG. 5A. In some embodiments, the passive component 3 can include cells having an effective capacitance per unit area of at least 5 $nF/mm^2$, at least 10 $nF/mm^2$, at least 20 $nF/mm^2$, at least 50 $nF/mm^2$, at least 100 $nF/mm^2$, or at least 200 $nF/mm^2$. For example, in various embodiments, the passive component 3 can include cells having an effective capacitance per unit area in a range of 5 $nF/mm^2$ to 400 $nF/mm^2$, in a range of 10 $nF/mm^2$ to 300 $nF/mm^2$, in a range of 10 $nF/mm^2$ to 250 $nF/mm^2$, in a range of 10 $nF/mm^2$ to 150 $nF/mm^2$, or in a range of 10 $nF/mm^2$ to 100 $nF/mm^2$. In some embodiments, for example, the passive component 3 can include cells having an effective capacitance per unit area in a range of 1 $nF/mm^2$ to 10 $nF/mm^2$, in a range of 10 $nF/mm^2$ to 100 $nF/mm^2$, in a range of 100 $nF/mm^2$ to 400 $nF/mm^2$, or above 400 $nF/mm^2$ (e.g., in a range of 400 $nF/mm^2$ to 1000 $nF/mm^2$). Beneficially, only the high K dielectric material may be used, such that there are no low K materials in series with the high K material. By using only high K materials, the overall capacitance of the passive component 3 can be improved.

FIG. 5B is a schematic side sectional view of the passive electronic component 3 of FIG. 5A, with a bonding layer 8a provided over the second patterned electrode 121. The bonding layer 8a can act as an interconnect layer, such as a redistribution layer (RDL) to bond the passive electronic component 3 to other structures, such as the element 2. For example, as explained above, the bonding layer 8a can comprise conductive features 9a connected to or defining contact pads and surrounding non-conductive field regions 7a. The conductive features 9a can comprise any suitable metal such as copper. The field regions 7a can comprise any suitable non-conductive material, such as silicon oxide. As shown in FIG. 5B, the non-conductive field regions 7a can be disposed in the gaps 123 of FIG. 5A so as to electrically separate the patterned portions of the second electrode 121 to define separate capacitive cells in some embodiments. Advantageously, providing the bonding layer 8a (e.g, with metals such as copper) on the passive electronic component 3 can enable the use of a low temperature anneal (e.g., less than 150° C.) to improve the direct bond and to reduce or eliminate thermal mismatch of materials due to different coefficients of thermal expansion (CTE). FIG. 5C is a schematic side sectional view of a portion of the semiconductor element 2 prior to bonding. The semiconductor element 2 can be the same as or generally similar to the semiconductor element 2 shown in FIG. 2, with traces 14 and vias 15 providing electrical communication with the element 2 between the conductive features 9b and active circuitry.

Figure 5D:
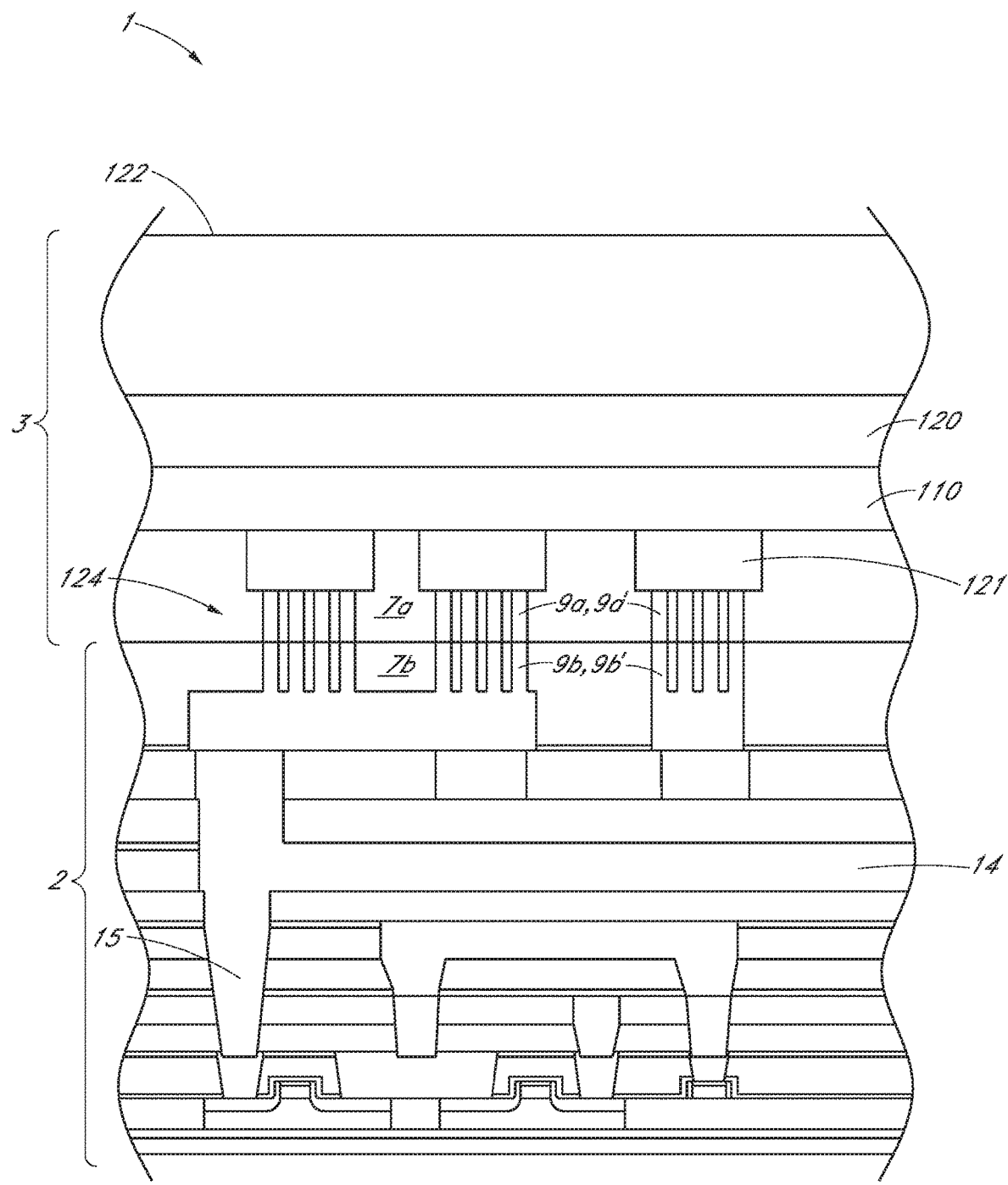
FIG. 5D is a schematic side sectional view of a bonded structure, in which the semiconductor element is directly bonded to the passive component that includes a high K dielectric material.

FIG. 5D is a schematic side sectional view of a bonded structure 1, in which the semiconductor element 2 is directly bonded to the passive component 3 that includes a high K dielectric material. As explained above, the bonding layers 8a, 8b of the passive component 3 and the semiconductor element 2 can be polished to a very low surface roughness. The polished surfaces can be activated and terminated with a desired species (such as nitrogen). The bonding layers 8a, 8b can be brought into direct contact (e.g., at room temperature) to form strong bonds between the respective field regions 7a, 7b, such as oxide materials. The structure 1 can be heated to increase the bond strength and to cause electrical connection between the conductive features 9a, 9b. Thus, as shown in FIG. 5D, the passive electronic component 3 can be directly bonded to the semiconductor element 2 along a direct bond interface 24 without an intervening adhesive. Beneficially, the use of a direct bond can provide a low impedance and low inductance electrical pathway between the semiconductor element 2 and the passive component 3, which can improve power or signal integrity. In other embodiments, however, the conductive features 9a, 9b can be adhered to one another with a conductive adhesive (e.g., solder) or can be bonded using thermocompression bonding techniques.

Figure 5E:
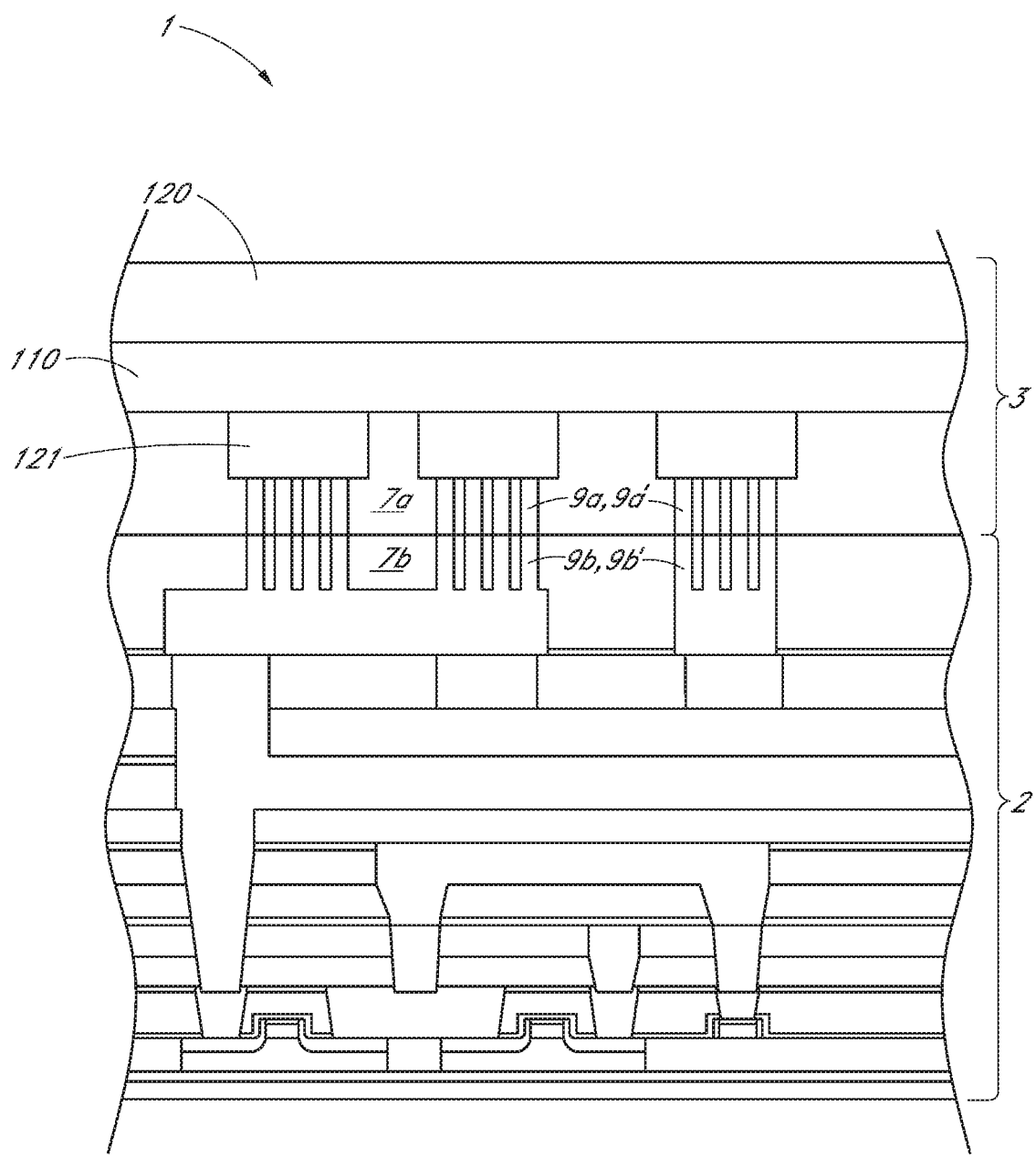
FIG. 5E is a schematic side sectional view of the bonded structure of FIG. 5D after removal of the sacrificial base.

As shown in FIG. 5E, the base 122 can be removed from the backside of the passive electronic component 3 (for example, by grinding, polishing, etching, etc.). In some embodiments, the first electrode 120 may also be patterned to further define the capacitance of the component 3. For example, noble or refractory metals can be used during processing to define the passive electronic component 3. In some arrangements, it may be desirable to add or deposit an additional metal electrode on the refractory metal to reduce the pad resistance or to meet a specific integration requirement. In other embodiments, however, the noble or refractory metals that serve as the first and second electrodes 120, 121 may not be removed and may thus remain in the resulting bonded structure 1. These noble or refractory metals may or may not be patterned to produce additional discrete electrode regions. In other embodiments, the first electrode 120 and/or the second electrode 121 can comprise sacrificial materials that can be removed and replaced by other metals. In FIG. 5E, the passive electronic component 3 is illustrated as being laterally wider than the semiconductor element 2. However, it should be appreciated that the passive electronic component 3 may cover only a portion of the semiconductor element 2. For example, as explained above, the passive component 3 can cover at least 55%, at least 65%, at least 75%, at least 85%, at least 95%, at least 99%, or at least 100% of the active surface 11 of the semiconductor element 2.

Figure 5G:
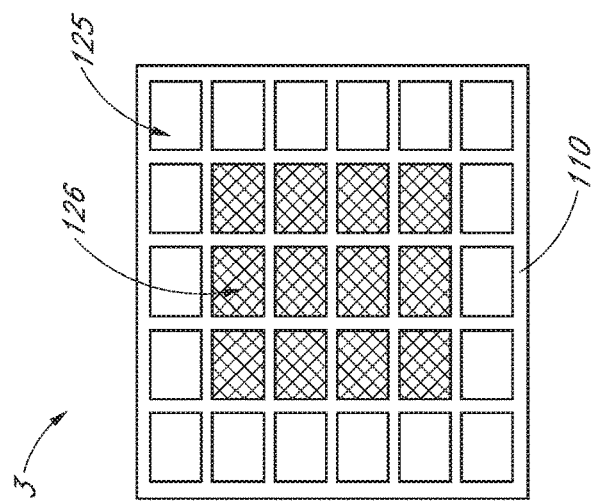
FIG. 5G is a top plan view of the passive electronic component of FIG. 5F.
Figure 5F:
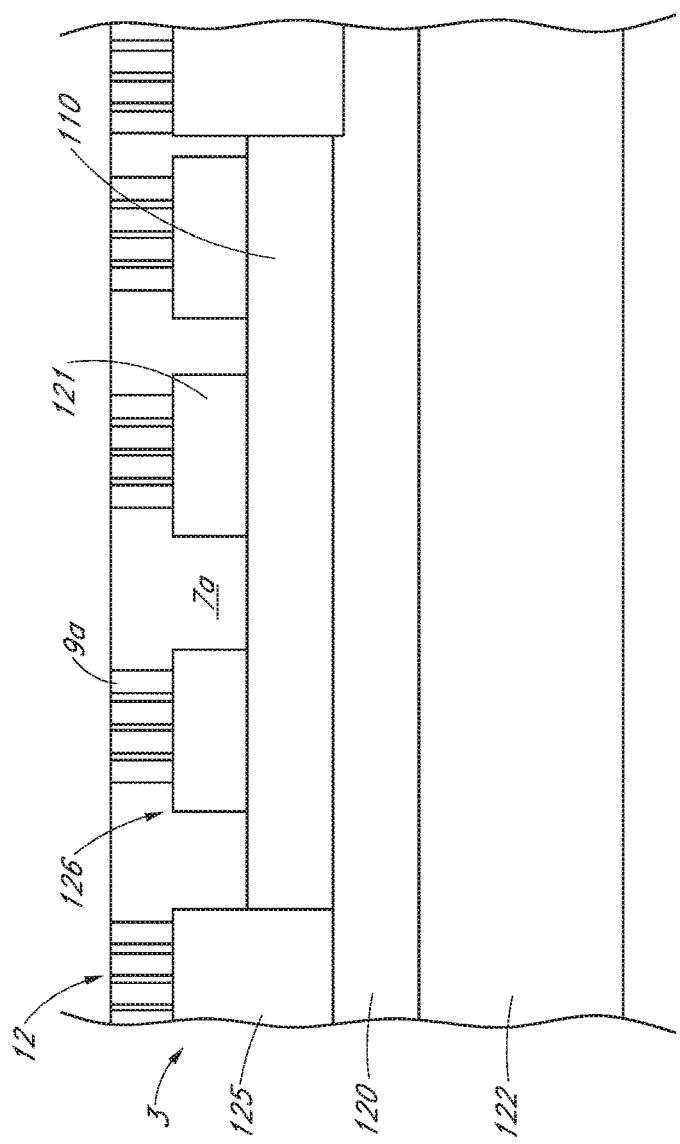
FIG. 5F is a schematic side sectional view of a passive electronic component with integrated power electrodes and ground electrodes.

FIG. 5F is a schematic side sectional view of a passive electronic component 3 with integrated power electrodes 126 (or signal electrodes) and ground electrodes 125. FIG. 5G is a top plan view of the passive electronic component 3 of FIG. 5F. As shown in FIG. 5F, the ground electrodes 125 can extend from the first surface 12, through the field regions 7a and the dielectric layer 110, and can contact the first electrode 120. In various embodiments, the first electrode 120 can be connected to electrical ground, which can provide a ground pin or terminal when connected with the semiconductor element 2. The power electrodes 126 shown in FIGS. 5A and 5B can comprise capacitive electrical pathways between the first surface 12 and the first electrode 120. Thus, when connected to the semiconductor element 2, electrical power can be transferred between the first surface 12 (by way of the conductive features 9a and/or contact pads 21) and portions of the first electrode 120, which can in turn connect to another structure, such as the package substrate 5. Although not illustrated, the first electrode 120 can be patterned or can be removed and replaced by an interconnect layer (such as a back-end of the line metallization layer) so as to provide electrical power along predefined electrical pathways.

Figure 5H:
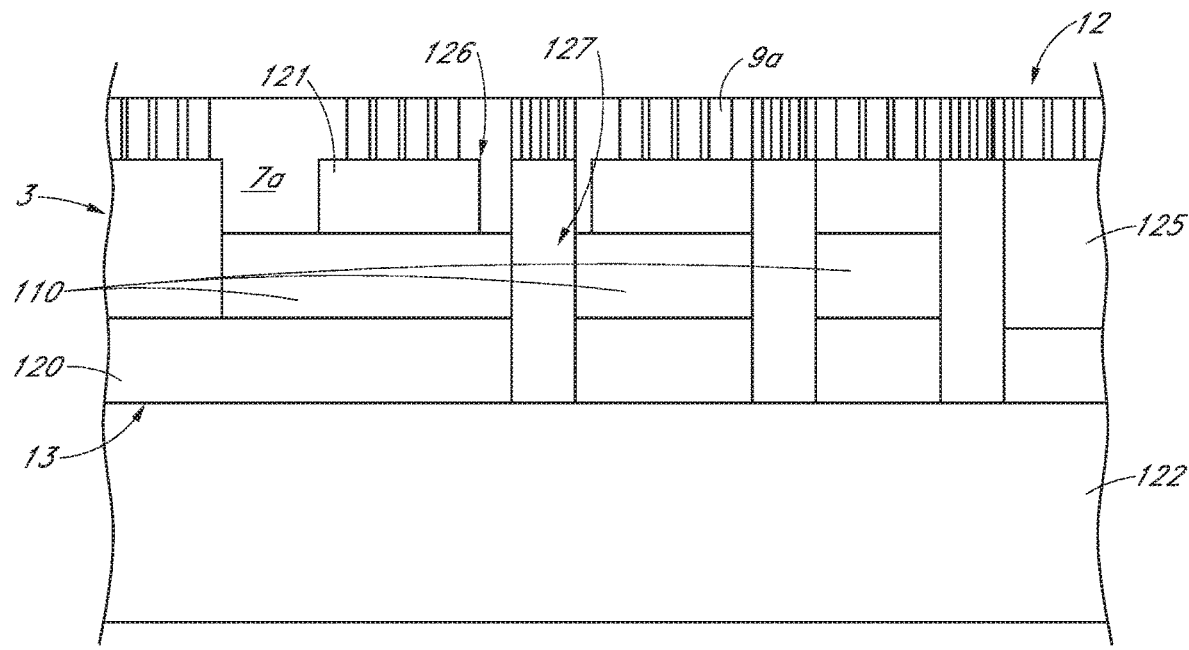
FIG. 5H is a schematic side sectional view of a passive electronic component according to another embodiment.
Figure 5I:
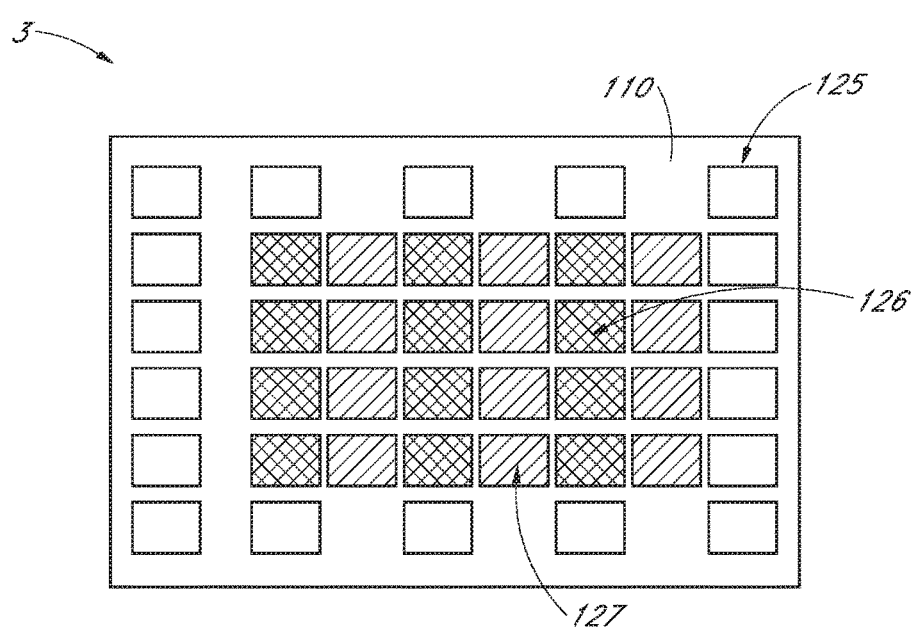
FIG. 5I is a top plan view of the passive electronic component of FIG. 5H.

FIG. 5H is a schematic side sectional view of a passive electronic component 3 according to another embodiment. FIG. 5I is a top plan view of the passive electronic component 3 of FIG. 5H. Unlike the embodiment of FIGS. 5F and 5G, in FIGS. 5H and 5I, the passive electronic component 3 can include shorted power electrodes 127, in addition to the power electrodes 126 and ground electrodes 125 shown in FIGS. 5F and 5G. As shown in FIG. 5H, for example, some power electrodes 127 may be connected to the second surface 13 of the component 3 by way of direct conductive interconnects. Thus, in FIGS. 5H and 5I, the power electrodes 126 may comprise capacitive electrical pathways between the conductive features 9a (or contact pads 21) and the second surface 13, while the shorted power electrodes 127 may comprise conductive or resistive electrical pathways between the conductive features 9a (or contact pads 21) and the second surface 13.

Thus, in the embodiments of FIGS. 5A-5I, high K, thin film dielectric materials can be used to define the passive electronic component 3. In some embodiments, the passive component 3 may be manufactured in one facility in order to form the high K material and electrodes (which may comprise noble or refractory metals suitable for contact with high K materials), and the semiconductor element 2 can be formed in another facility to form the active components and interconnects of the element 2. Beneficially the noble or refractory metals can be provided to enable high temperature processing. As explained above, in some embodiments, the noble or refractory metals can be removed and replaced by other metals, such as copper, or by other metallization or routing layers. In other embodiments, the noble or refractory metals can be kept in the ultimate bonded structure 1. The passive component 3 can be bonded (e.g., directly bonded) to the semiconductor element 2, which can provide a low impedance and low inductance connection to improve signal and/or power integrity of the bonded structure 1.

Figure 6:
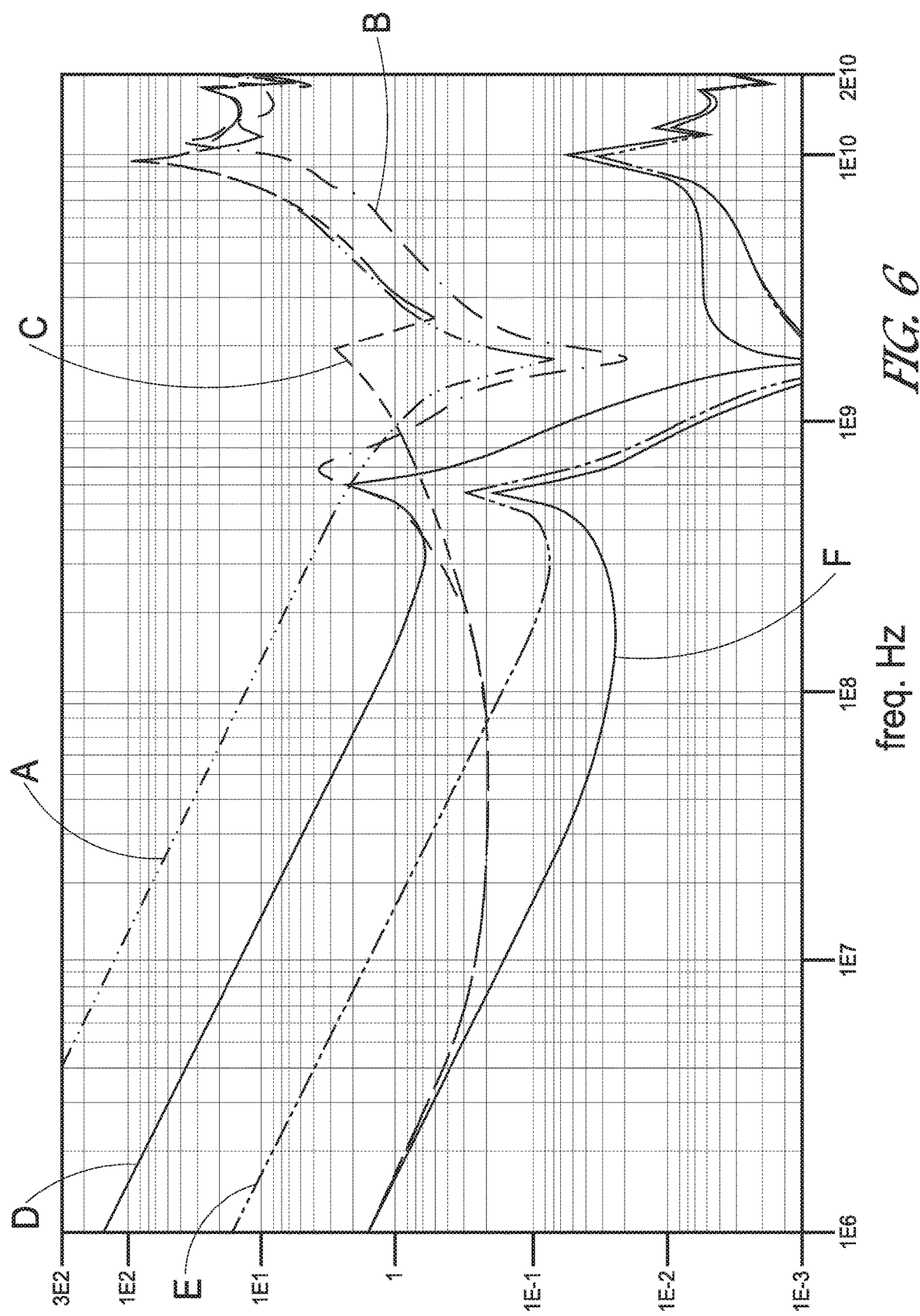
FIG. 6 is a plot of the transfer impedance as a function of frequency for various devices having different passive electronic components.

FIG. 6 is a plot of the transfer impedance of various devices as a function of signal frequency, including a processor die without a capacitive element (plot A), a processor die with a 100 nF discrete capacitor mounted thereon (plot B), a processor die with a 100 nF capacitor mounted to the package substrate (plot C), a processor die with a 100 nF capacitive sheet similar to those disclosed in the embodiments of FIGS. 1-5I (plot D), a processor die with a 10 nF capacitive sheet similar to those disclosed in the embodiments of FIGS. 1-5I (plot E), and a processor die with a 1 nF capacitive sheet similar to those disclosed in the embodiments of FIGS. 1-5I (plot F). As shown in FIG. 6, the conventional devices reflected in plots A, B, and C have relatively high transfer impedance values at frequencies above 500 MHz and/or above 1 GHz. Such high impedances above 500 MHz or 1 GHz may reduce the power or signal integrity of the processor dies. By contrast, as reflected in Plots D, E, and F, the embodiments disclosed herein enable significantly reduced impedance at frequencies above 500 MHz, e.g., at or above 1 GHz, which can provide improved signal or power integrity at these higher frequencies. For example, the embodiments disclosed herein can provide impedance at 1 GHz that is at least 10 times, e.g., at least 100 times, less than the impedance of the conventional devices shown in Plots A-C. At the same capacitance levels, the directly bonded capacitance sheets show improved performance over discrete capacitors mounted on either the processor die or the package substrate. Moreover, as shown in FIG. 6, the embodiments disclosed herein can provide the reduced impedance, even at significantly lower effective capacitances (e.g., at capacitances as low as about 1 nF or 10 nF). Thus, the embodiments disclosed herein can advantageously provide reduced impedances with effective capacitance values in a range of about 0.5 nF to 10 mF, in a range of about 0.5 nF to 1 mF, in a range of about 0.5 nF to 1 µF, in a range of about 0.5 nF to 150 nF, in a range of about 1 nF to 100 nF, or in a range of about 1 nF to 10 nF.

Figure 7A:
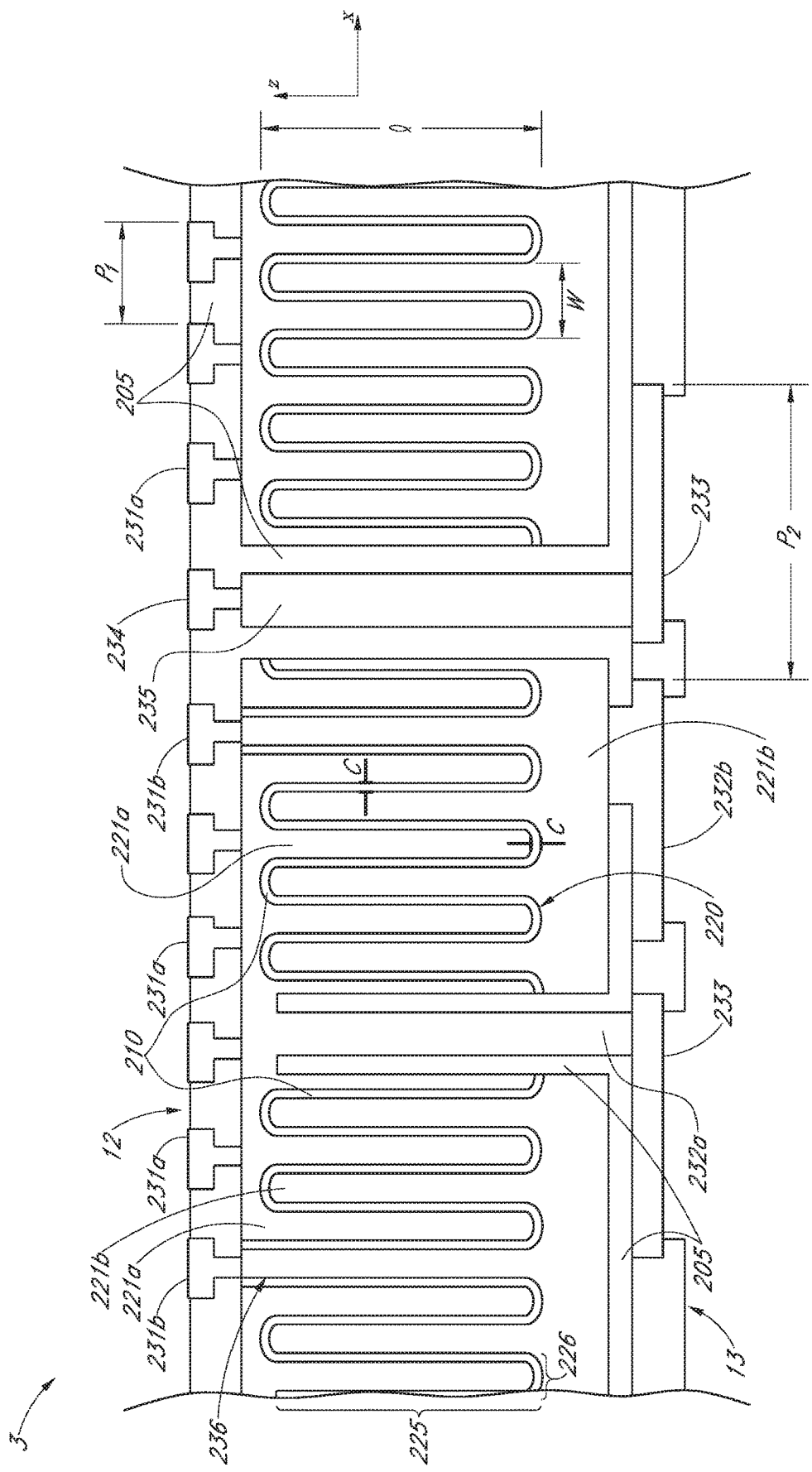
FIG. 7A is a schematic side sectional view of a passive electronic component, according to another embodiment.

FIG. 7A is a schematic side sectional view of a passive electronic component 3, according to another embodiment. Unless otherwise noted, the passive electronic component 3 of FIG. 7A can be bonded to the element 2 (which may comprise a semiconductor element or a non-semiconductor element) described herein. In various embodiments, the passive electronic component can comprise a first surface 12 directly bonded to the element 2 (not shown in FIG. 7A) without an intervening adhesive. A second surface 13 can electrically connect to a package substrate (such as the substrate 5) or other packaging or system structure. The passive component 3 shown in FIG. 7A beneficially comprises capacitors in which a majority of electrode surfaces are disposed non-parallel to (e.g., generally perpendicular to) the element 2 and the surfaces 12, 13. For example, as shown in FIG. 7A, one or more capacitors 220 can be defined in which a majority of electrode surfaces generally extend parallel to the z-axis, which can be non-parallel or perpendicular to the major surface of the passive element 3 (e.g., the x-y plane), e.g., the surfaces 12, 13.

In the embodiment illustrated in FIG. 7A, the capacitor 220 can comprise a first electrode 221a (which may comprise one of an anode and a cathode) and a second electrode 221b (which may comprise the other of the anode and the cathode) spaced apart from one another by an intervening dielectric 210. As explained above in connection with FIG. 1B, in FIG. 7A, the anode and cathode terminals of the passive electronic component 3 can be disposed along the same side or surface of the component 3. The capacitor 220 can be defined within a base 205 that can comprise an insulating or dielectric material, such as silicon, silicon oxide, etc. The electrodes 221a, 221b and the dielectric 210 can include major surfaces that primarily extend along the direction non-parallel to the surfaces 12, 13, which corresponds to the z-axis in FIG. 7A. In various embodiments, the capacitor 220 can have a serpentine profile extending along the x-axis. For example, as shown in FIG. 7A, the electrodes 221a, 221b and dielectric 210 can have respective vertical portions 225 that are generally vertical, e.g., extending along the z-axis non-parallel or perpendicular to the first and second surfaces 12, 13. The vertical portions 225 can be connected by corresponding lateral portions 226 of the electrodes 221a, 22b and dielectric 210, such that the vertical portions 225 and the lateral portions 226 define a generally serpentine capacitor within the passive element 3. As shown in FIG. 7A, a capacitance C can be provided between the two electrodes 221a, 221b along the entirety of the serpentine capacitor 220. In various embodiments, the overall capacitance C along the capacitor 220 can be in a range of 100 nF/mm$^2$ to 20 µF/mm$^2$, or in a range of 100 nF/mm$^2$ to 10 µF/mm$^2$. Beneficially, the use of a serpentine capacitor in which the predominant surfaces of the capacitor 220 lie along planes parallel (or close to parallel) to the vertical z-axis can significantly increase the overall surface area of the electrodes 221a, 221b, and, therefore, can accordingly increase the overall capacitance provided by the passive element 2. The electrodes 221a, 221b can comprise any suitable type of conductor, such as aluminum, silicon, doped silicon, nickel, or other materials. The dielectric 210 can comprise any suitable dielectric material, such as aluminum oxide, silicon oxide, etc. In some embodiments, increased capacitance can be provided by using high dielectric materials (e.g., k>10), such as $HfO_2$, $ZrO_2$, BST, SBT, etc.

The capacitors 220 can electrically connect to the element 2 (not shown) by way of upper terminals 231a, 231b and to the package substrate 5 (not shown) or another element by way of lower terminals 232a, 232b. As shown in FIG. 7A, first terminals 231a can provide electrical communication to the first electrode 221a. Second terminals 231b can provide electrical communication to the second electrode 221b which may be of a different type than the first terminals 231a. For example, as shown in FIG. 7A, first terminals 231a can extend through the insulating base 205 to contact an upper portion of the first electrode 221a, and can be exposed at the first surface 12 of the passive component 3. The second terminals 231b can extend through the insulating base 205 and can contact an extension portion 236 of the second electrode 221b. As shown in FIG. 7A, for example, the extension portion 236 of the second electrode 221b can extend through the material of the first electrode 221a, with the dielectric 210 intervening between the first electrode 221a and the extension portion 236 of the second electrode 221b. Still other ways to electrically connect to the capacitors 220 may be suitable.

Further, as shown in FIG. 7A, first lower terminals 232a can provide electrical communication to the first electrode 221a. The second lower terminals 232b can provide electrical communication to the second electrode 221b. Thus, in various embodiments, at the first surface 12, upper terminals 231a can electrically connect to the first electrodes 221a (e.g., one of an anode or a cathode), and upper terminals 231b can electrically connect to the second electrodes 221b (e.g., the other of an anode and a cathode). At the second surface 13, lower terminals 232a can electrically connect to the first electrodes 221a (e.g., one of an anode or a cathode), and lower terminals 232b can electrically connect to the second electrodes 221b (e.g., the other of an anode and a cathode). Accordingly, each surface 12, 13 can comprise anode and cathode terminals (e.g., different types of terminals).

The passive electronic component 3 can also have a through signal connector 235 extending through the thickness of the passive electronic component 3. The through signal connector 235 can comprise a conductor that provides a conductive pathway between a first through signal terminal 234 on the first surface 12 and a second through signal terminal 233 on the second surface 13. Any or all of the upper terminals 231a, 231b, the lower terminals 232a, 232b, and the through signal terminals 234, 233 can be configured for direct bonding to the element 2 and/or to the system board. Thus, the passive electronic component 3 shown in FIG. 7A can beneficially provide capacitive pathway(s) and conductive through signal pathway(s). Accordingly, passive devices with relatively high capacitance can be provided in line with the integrated circuit, without occupying separate real estate for the system, without interfering with direct signal connections. Disposing the capacitor 220 with a majority of electrode surfaces along (or close to parallel with) the vertical direction can beneficially improve capacitance by significantly increasing the effective surface area of the electrodes 221a, 221b.

As shown in FIG. 7A, the upper terminals 231a, 231b and the through signal terminals 234 can be laterally spaced at a finer pitch than the lower terminals 232a, 232b and the through signal terminals 233. For example, in various embodiments, an upper pitch $p_1$ of the terminals on the first surface 12 (e.g., the terminals 231a, 231b, and 234) can be spaced at a pitch less than 50 microns, or less than 40 microns. In various embodiments, the upper pitch $p_1$ can be in a range of 0.5 microns to 50 microns, in a range of 0.5 microns to 40 microns, in a range of 0.5 microns to 20 microns, in a range of 0.5 microns to 10 microns, or in a range of 1 micron to 10 microns. The fine pitch of the upper terminals 231a, 231b and the terminals 234 can provide a relatively high number of channels for connection to the element 2. By contrast, a lower pitch $p_2$ of the lower terminals 232a, 232b and the terminals 233 can be selected for suitable connection to the system motherboard. The lower pitch $p_2$ can be less than 200 microns, or less than 150 microns. For example, the lower pitch $p_2$ can be in a range of 50 microns to 200 microns or in a range of 50 microns to 150 microns. Accordingly, the passive component serves both to provide high capacitance passive devices and serves as an interposer without occupying separate real estate.

The vertical capacitors 220 can be defined in any suitable manner. For example, the second electrode 221b can be defined from an initially planar sheet of porous silicon, porous aluminum, etc. The upper surface of the planar sheet can be masked and etched such that channels can be etched into the sheet of the second electrode 221b material. The dielectric 210 can be conformally deposited into the channels over the etched surface of the porous aluminum or porous silicon. For example, the dielectric 210 can be deposited by physical vapor deposition (PVD), chemical vapor deposition (CVD) or atomic layer deposition (ALD). An additional conductive material (e.g., aluminum) can be deposited, coated or otherwise applied over the dielectric 210 to define the first electrodes 221a. In some embodiments, the first and second electrodes 221a, 221b can comprise the same material. In other embodiments, the first and second electrodes 221a, 221b can comprise different materials. Advantageously, the illustrated structure with vertical channels or fins can be readily defined with fewer masking steps compared to horizontal fins.

Figure 7B:
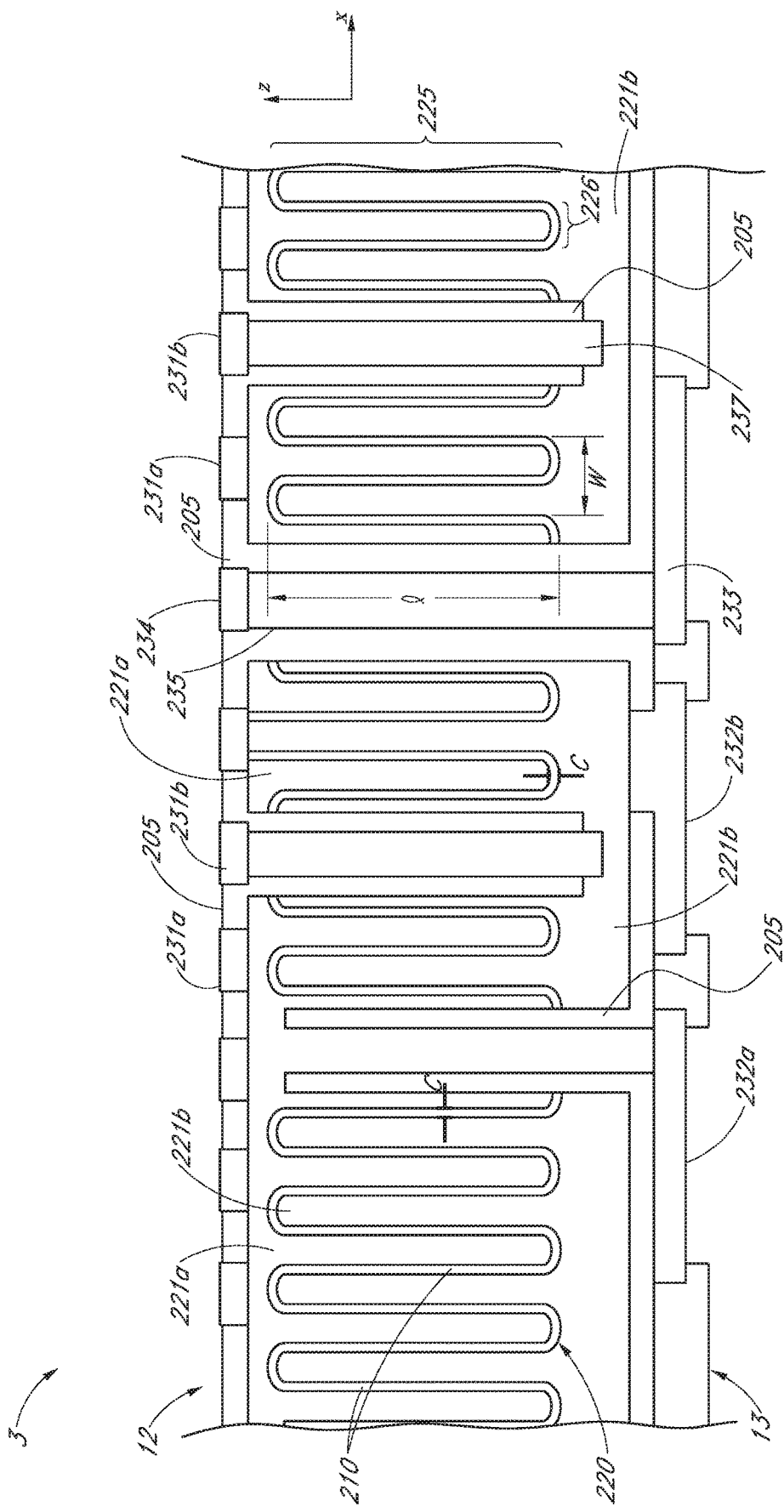
FIG. 7B is a schematic side sectional view of a passive electronic component, according to yet another embodiment.

FIG. 7B is a schematic side sectional view of a passive electronic component 3 according to another embodiment. Unless otherwise noted, reference numerals in FIG. 7B refer to the same or similar features as like-numbered components in FIG. 7A. For example, as with FIG. 7A, the passive electronic component 3 of FIG. 7B can comprise a capacitor 220 in which a majority of electrode surfaces are vertically positioned and that defines a serpentine pattern along the x-axis. Major surfaces of the first and second electrodes 221a, 221b and the intervening dielectric 210 can primarily extend non-parallel or perpendicular to the first and second surfaces 12, 13. As with FIG. 7A, first upper terminals 231a can electrically connect to the first electrode 221a at or near the first surface 12. Further, as with FIG. 7A, in FIG. 7B, each surface 12, 13 of the passive component 3 can comprise anode and cathode terminals, such that anode and cathode terminals can be disposed along the same side or surface of the component 3 (e.g., terminals 231, 231b at surface 12 and terminals 232a, 232b at surface 13). Unlike in FIG. 7A, however, in which an extension portion 236 of the second electrode 221b contacts the corresponding second upper terminal 221b, in FIG. 7B, a separate vertical connector 237 can extend downwardly into the passive element 3 to electrically connect the second upper terminal 231b with the second electrode 221b.

Figure 7C:
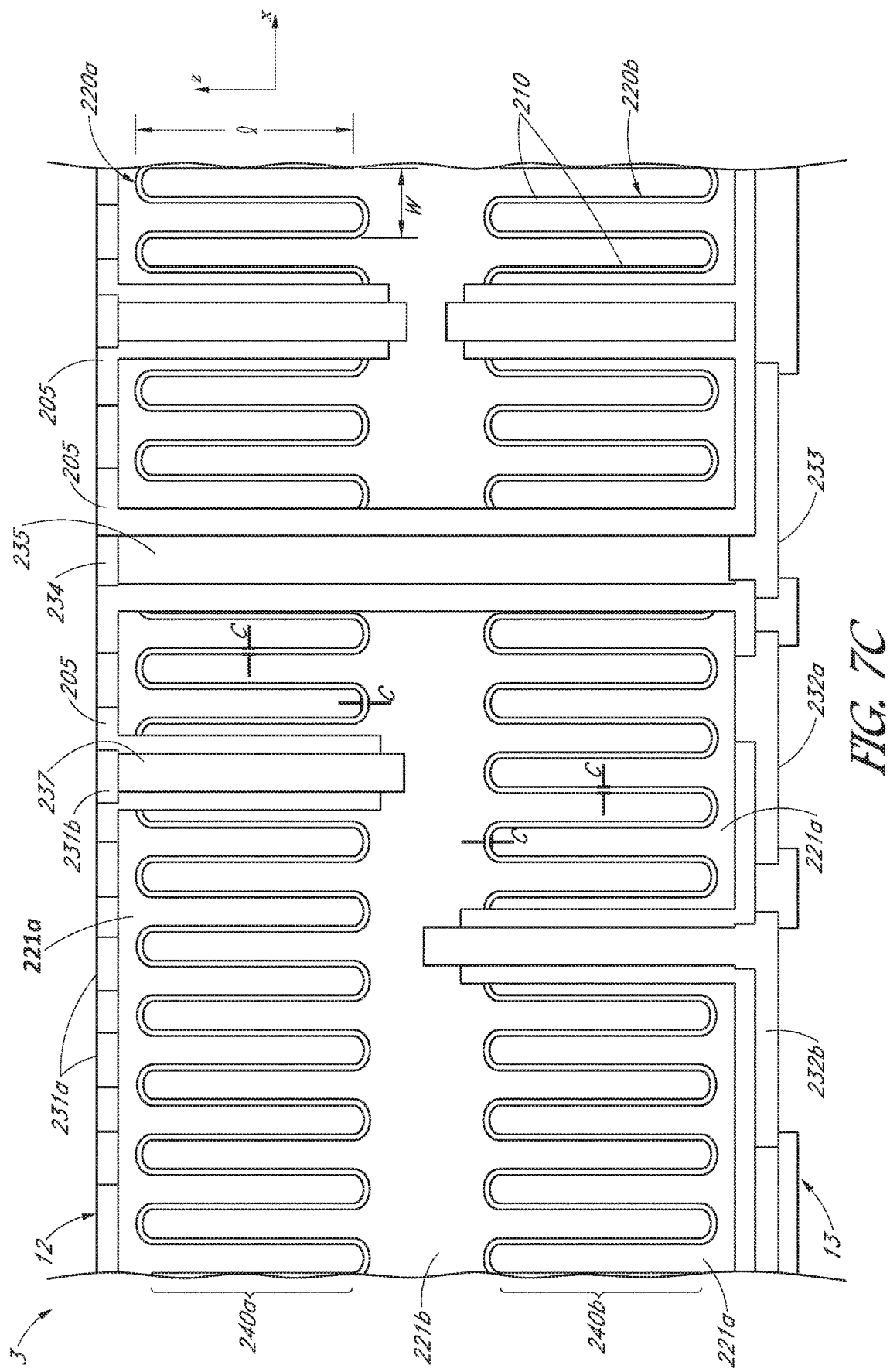
FIG. 7C is a schematic side cross-sectional view of a passive electronic component, according to another embodiment.

FIG. 7C is a schematic side cross-sectional view of a passive electronic component 3, in which one or more serpentine capacitors may be defined along both sides of the second electrode 221b. Multiple, separate capacitors may be defined within the passive electronic component 3 in various embodiments. Unless otherwise noted, reference numerals in FIG. 7C refer to the same or similar features as like-numbered components in FIGS. 7A and 7B. As with FIGS. 7A-7B, the passive electronic component 3 of FIG. 7C with a majority of electrode surfaces that can extend generally vertically and non-parallel relative to the first and second surfaces 12, 13. Further, as with FIGS. 7A-7B, in FIG. 7C, each surface 12, 13 of the passive component 3 can comprise anode and cathode terminals, such that anode and cathode terminals can be disposed along the same side or surface of the component 3 (e.g., terminals 231, 231b at surface 12 and terminals 232a, 232b at surface 13). Unlike the embodiment of FIGS. 7A-7B, however, in FIG. 7C, upper capacitor(s) 220a can be defined in an upper portion 240a of the passive component 3, and lower capacitor(s) 220b can be defined in a lower portion 240b of the passive component 3. In the embodiment of FIG. 7C, both sides of the initial planar sheet of aluminum or silicon can be masked and simultaneously etched to define channels within the second electrode 221b. Dielectric 210 can be deposited on both the upper and lower portions 240a, 240b. Similarly, conductive material can be deposited over the dielectric 210 on the upper and lower portions 240a, 240b to define the first electrode 221a. The embodiment of FIG. 7C can beneficially further increase the overall surface area of the electrodes 221a, 221b and thus the overall capacitance of the passive electronic component 3.

Figure 7D:
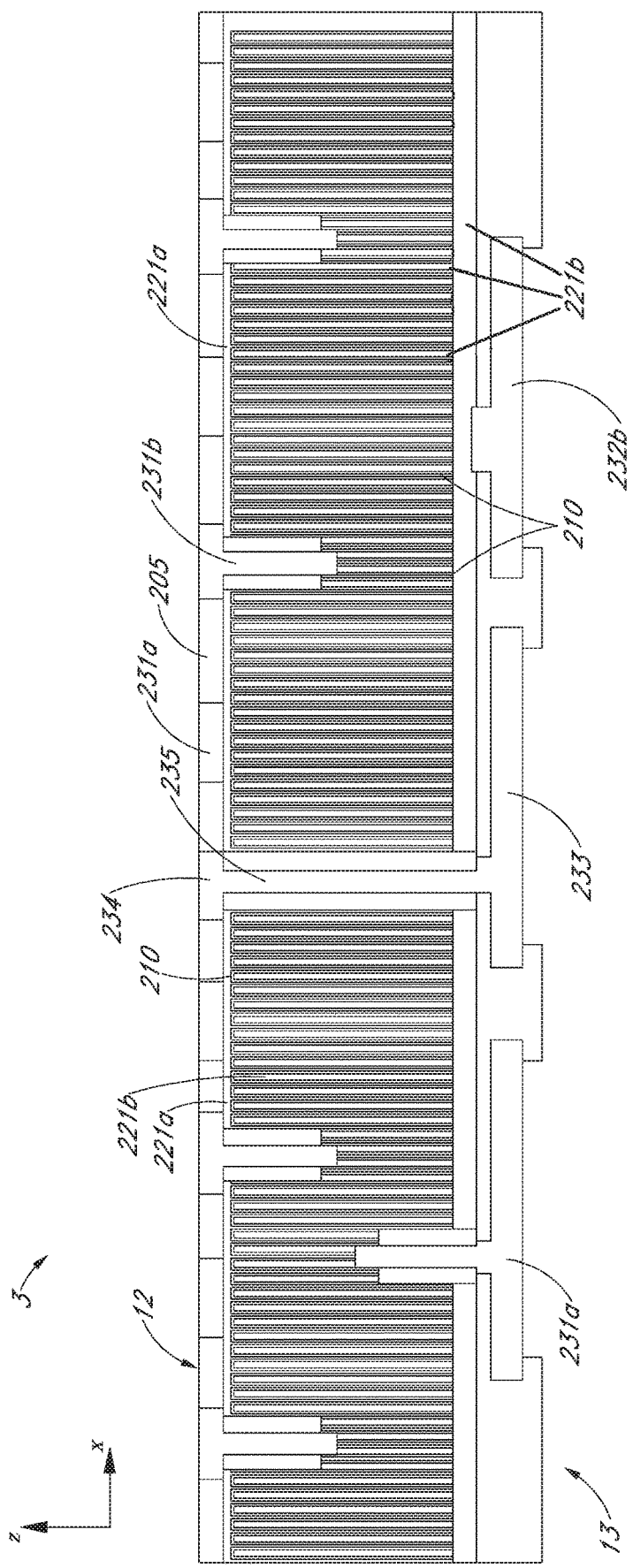
FIG. 7D is a schematic side cross-sectional view of a passive electronic component, in which capacitor(s) can be defined by aligned fibers.

FIG. 7D is a schematic side cross-sectional view of a passive electronic component 3, in which capacitor(s) 220 can be defined by aligned fibers (e.g., carbon fibers) extending along the non-parallel direction z. Unless otherwise noted, reference numerals in FIG. 7D refer to the same or similar features as like-numbered components in FIGS. 7A-7C. As with FIGS. 7A-7C, the passive electronic component 3 of FIG. 7D can have a majority of electrode surfaces that can extend generally vertically and non-parallel relative to the first and second surfaces 12, 13. Further, as with FIGS. 7A-7C, in FIG. 7D, each surface 12, 13 of the passive component 3 can comprise anode and cathode terminals, such that anode and cathode terminals can be disposed along the same side or surface of the component 3 (e.g., terminals 231a, 231b at surface 12 and terminals 232a, 232b at surface 13). In such embodiments, fibers (such as elongate carbon fibers) can act as the second electrode 221b. The fibers can be coated with non-conductive material to define the dielectric 210, and can be subsequently coated with conductive material to define the first electrode 221a. Still other ways of forming the vertical capacitors 220 may be suitable.

The capacitors 220 shown in FIGS. 7A-7D can be elongated, e.g., heights l of the electrode surfaces of the capacitors 220 (e.g., which may be defined by the lengths of the electrodes 221a, 221b) along the non-parallel direction z may be longer than corresponding widths w of undulations of the capacitors 220 along the major lateral surface x-y. As shown in FIGS. 7A-7D, the widths w can be defined according to the pitch of the capacitors 220, e.g., a width of a single undulation of the capacitor. An aspect ratio of the capacitors 220 can be defined by l divided by w. In various arrangements, the aspect ratio can be greater than 5:1. Beneficially, the elongate capacitors 220 illustrated in FIGS. 7A-7D can provide increased electrode surface area as compared with other passive devices without entailing greater masking steps. The increased surface areas can significantly increase overall capacitance, even when used with low dielectric constant materials.

FIGS. 8A-8D illustrate another embodiment of a passive electronic component 3 that comprises one or a plurality of capacitors 305. Unless otherwise noted, the components of FIGS. 8A-8D may include components or features that are generally similar to like-numbered components of FIGS. 7A-7D, with the reference numerals incremented by 100 relative to the reference numerals of FIGS. 7A-7D. For example, as with FIG. 7D, the passive electronic component 3 includes a plurality of elongate fibers extending along the vertical or non-parallel direction z. In various embodiments, the elongate fibers can serve as an electrode of the capacitor, and can be vertically aligned in an array.

FIG. 8A is a schematic side sectional view of a partially-fabricated passive electronic component 3, according to another embodiment. FIG. 8B is an enlarged side sectional view of FIG. 8A illustrating a capacitor 305 of the passive electronic component 3. A carrier 306 can be provided to support the capacitors 305. In some embodiments, as explained below, the carrier 306 may be sacrificial, e.g., the carrier 306 may be used to support the passive electronic component 3 during manufacturing but removed from the passive electronic component 3 thereafter. In other embodiments, however, the carrier 306 may not be sacrificial and can comprise an active integrated device die, an interposer, a reconstituted wafer, a packaging substrate, or any other suitable carrier maintained in the modules to be formed. In some embodiments, the carrier 306 comprises a dielectric material, a semiconductor material (e.g., silicon), sapphire, quartz, glass, a metal, or any other suitable material sufficiently strong or stiff so as to support the passive electronic component 3 during manufacturing.

A first nonconductive layer 308 can be deposited over the carrier. In various embodiments, the first nonconductive layer 308 can comprise a dielectric material such as silicon oxide, silicon nitride, etc. A first conductive layer 321a can be provided on portions of the first nonconductive layer 308. In some embodiments, the first conductive layer 321a can be provided on top of the upper surface of the first nonconductive layer 308. In other embodiments, the first conductive layer 321a can be at least partially embedded in the first nonconductive layer 308 with the upper surface of the first conductive layer 321a exposed. The first conductive layer 321a can serve as at least a portion of a first electrode of the capacitor 305. The first conductive layer 321a can comprise any suitable type of conductive material, such as a metal. In various embodiments, the first conductive layer 321a can comprise copper.

A plurality of elongate fibers 322 can be formed to extend non-parallel (e.g., generally perpendicular to) the first conductive layer 321a. In various embodiments, the fibers 322 can be grown vertically from the first conductive layer 321a. The fibers 322 can be laterally spaced from one another; in some embodiments, the fibers 322 can be generally parallel or aligned with one another. In various implementations, a precursor or catalytic metallic layer can be provided over the first conductive layer 321a. The precursor can be grown into the fibers 322 using any suitable technique, such as thermal chemical vapor deposition (CVD). The elongate fibers 322 can comprise any suitable elongate, thin conductive fiber, such as a carbon nanotube. In various embodiments, suitable growth techniques can be used to engineer the fibers 322 so as to have desired conductive properties for the capacitors 305. The fibers 322 can be electrically connected to the first conductive layer 321a and, in cooperation with the first conductive layer 321a, can serve as a portion of the first electrode of the capacitor 305.

In various embodiments, the fibers 322 may not be completely straight or linear. Rather, the fibers 322 may have curls or waves along their lengths. Moreover, in some embodiments, some fibers 322 may not be parallel with one another. Rather, fibers 322 may cross one another or otherwise be non-parallel relative to one another. In various embodiments, a length of the fibers 322 can be less than 30 µm, less than 20 µm, less than 10 µm, or less than 5 µm. For example, in various embodiments, the length of the fibers 322 can be in a range of 1 µm to 30 µm, 1 µm to 5 µm, 5 µm to 30 µm, in a range of 5 µm to 20 µm, or in a range of 10 µm to 20 µm. In some embodiments, width of the fibers 322 can be less than 150 nm, or less than 100 nm. For example, in various embodiments, the width of the fibers 322 can be in a range of 40 nm to 150 nm, or in a range of 40 nm to 100 nm. In various embodiments, at least some of the fibers 322 can be spaced from one another by less than 150 nm, or less than 100 nm. For example, in various embodiments, the spacing between adjacent fibers 322 can be in a range of 40 nm to 150 nm, or in a range of 40 nm to 100 nm.

A second nonconductive layer 310 can be provided (e.g., deposited) over the elongate fibers 322 (e.g., surrounding upper and side surfaces of the fibers 322), portions of the upper surface of the first conductive layer 321a, and portions of the upper surface of the first nonconductive layer 310. The second nonconductive layer 310 can comprise a dielectric material, such as silicon oxide, silicon nitride, etc. Still other types of nonconductive materials may be suitable for the second nonconductive layer 310. In various embodiments, the second nonconductive layer 310 can serve as the intervening dielectric, or capacitor dielectric, for the capacitors 305.

As shown in FIGS. 8A-8B, a second conductive layer 321b can be provided (e.g., deposited) over the second nonconductive layer 310, thus surrounding the upper and side surfaces of the second nonconductive layer 310. The second conductive layer 321b can serve as the second electrode of the capacitors 305. The second conductive layer 321b can comprise any suitable type of conductive material, such as a metal like copper. As shown in FIGS. 8A-8B, the second nonconductive layer 310 and the second conductive layer 321b can conformally coat the fibers 322.

Thus, in FIGS. 8A-8B, the first conductive layer 321a and the fibers 322 can serve as the first electrode of the capacitors 305, and the second conductive layer 321b can serve as the second electrode of the capacitors 305. As shown the first and second conductive layers 321a and 321b can be differently patterned to have one extend out on one side of each capacitor 305 and the other extend out on a different side of each capacitor 305, which facilitates subsequent contacts. The second nonconductive layer 310 can serve as the intervening dielectric for the capacitors 305. A first capacitance $C_1$ can be defined between the first and second conductive layers 321a, 321b, for example, along horizontal surfaces parallel to the first nonconductive layer 308 or the carrier 306. A second capacitance $C_2$ can be defined between the elongate fibers 322 and the second conductive layer 321b, for example along vertical (such as cylindrical) surfaces perpendicular to the carrier 306. Beneficially, the use of thin elongate fibers 322 can enable high capacitance applications for the passive electronic component 3 due at least in part to the increased surface area of the capacitors 305 shown in FIGS. 8A-8B.

In FIG. 8C, a third nonconductive layer 309 can be provided (e.g., deposited) over the second conductive layer 321b and exposed portions of the first nonconductive layer 306 and first conductive layer 321a. The third nonconductive layer 309 can comprise any suitable type of nonconductive material, such as a dielectric like silicon oxide, silicon nitride, etc. As shown in FIG. 8C, the capacitors 305 can be completely embedded within the first and third nonconductive materials 308, 309.

Turning to FIG. 8D, in some embodiments, as shown in the leftmost capacitor 305a of FIG. 8D, vias 336a, 336b can be provided to electrically connect to the first and second conductive layers 321a, 321b, respectively, on different sides of the capacitor 305a. In other embodiments, as shown for the two capacitors 305b, 305c on the right of FIG. 8D, vias, terminals, or other electrical contacts can be provided at later stages of the manufacturing or packaging process. For the leftmost capacitor 305a of FIG. 8D, openings can be formed through the third nonconductive layer 309, the first conductive layer 321a, and the first nonconductive layer 308. A first via 336a can be provided within the opening from the first surface 12 of the passive electronic component 3 to the second surface 13 of the passive electronic component 3. As explained below in, e.g., FIGS. 11B and 12B, the carrier 306 can be removed in some embodiments such that the lower surface of the first nonconductive layer 308 can at least partially define the second surface 13. The first via 336a can electrically contact the first conductive layer 321a, e.g., along side edges of the first conductive layer 321a. As shown in FIG. 8D, a first upper terminal 331a of the via 336a can be exposed at or near the first surface 12 of the passive electronic component 3. A first lower terminal 332a of the via 336a can be exposed at or near the second surface 13 of the passive electronic component 3.

Similarly, to form the second via 336b, openings can be formed through the third nonconductive layer 309, the second nonconductive layer 310, the second conductive layer 321b, and the first nonconductive layer 308. The second via 336b can be provided within the opening from the first surface 12 of the passive electronic component 3 to the second surface 13 of the passive electronic component 13. The second via 336b can electrically contact the second conductive layer 321b, e.g., along side edges of the second conductive layer 321b. As shown in FIG. 8D, a second upper terminal 331b of the via 336b can be exposed at or near the first surface 12 of the passive electronic component 3. A second lower terminal 332b of the via 336b can be exposed at or near the second surface 13 of the passive electronic component 3.

Accordingly, in the embodiment shown in FIG. 8D, each surface 12, 13 of the passive electronic component 3 can include electrical terminals of different types. For example, the first surface 12 of the passive electronic component 3 can include the first terminal 331a (such as an anode) and the second terminal 331b (such as a cathode) which can be of a different type or polarity from the first terminal 331a. Similarly, the second surface 13 of the passive electronic component 3 can include the first terminal 332a (such as an anode) and the second terminal 332b (such as a cathode) which can be of a different type or polarity from the first terminal 332a. As explained herein, other devices, dies, or components can connect to both surfaces 12, 13 of the passive electronic component 3.

The passive electronic component 3 shown in FIG. 8D can be significantly thinner than other capacitors, while providing a high capacitance due to the increased surface area of the electrode surfaces. For example, in various embodiments, a thickness t of the passive electronic component 3 defined between opposing surfaces of the first and third nonconductive layers 308, 309 can be less than about 20 µm, less than about 10 µm, or less than about 5 µm. In various embodiments, the thickness t of the passive electronic component 3 can be in a range of 0.5 µm to 20 µm, in a range of 0.5 um to 10 µm, in a range of 0.5 µm to 5 µm, in a range of 1 µm to 10 µm, or in a range of 1 µm to 5 µm.

Figure 9C:
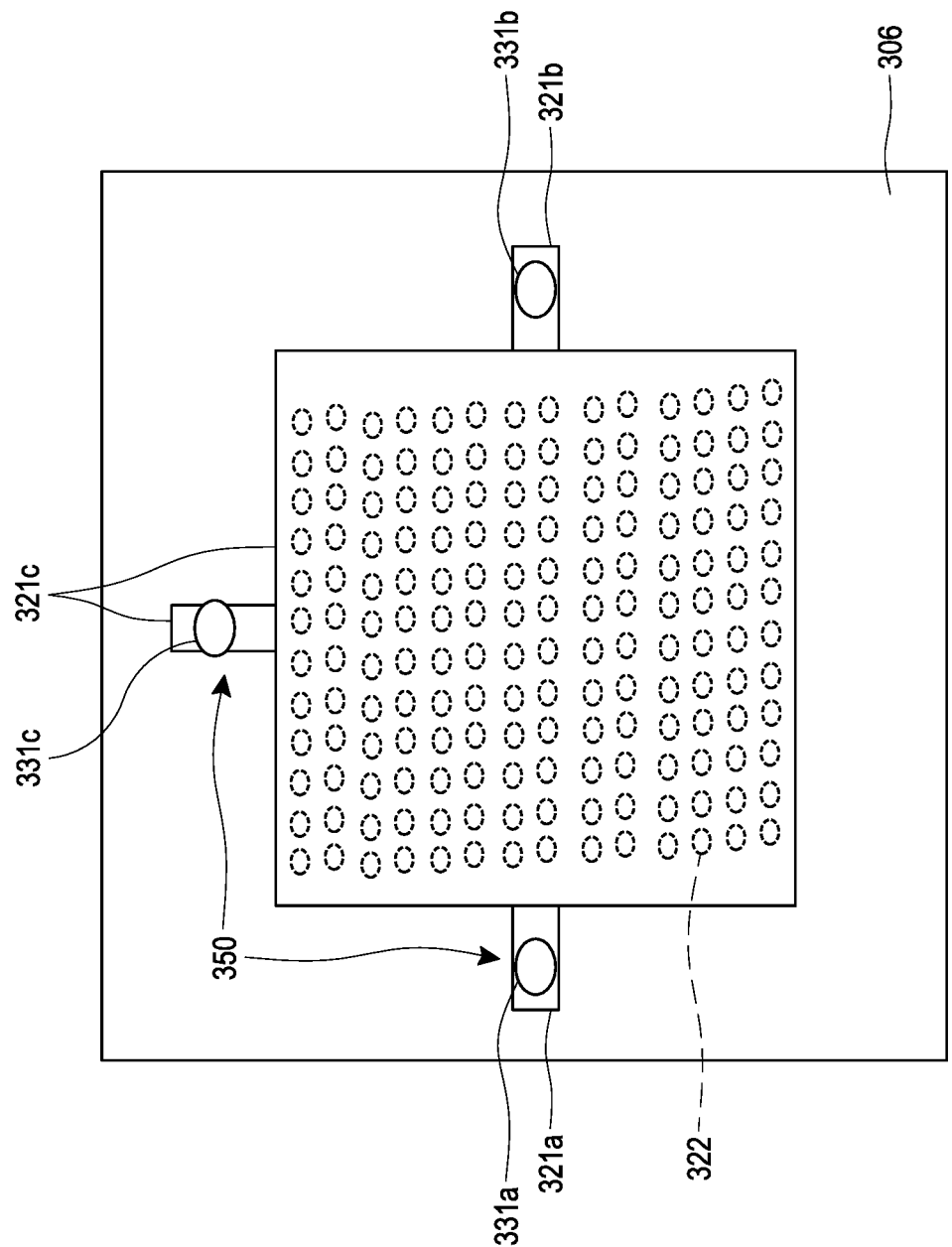
FIG. 9C is a top plan view of the partially-fabricated passive electronic component of FIG. 9A.

FIGS. 9A-9C illustrate another embodiment of a partially-fabricated passive electronic component 3. Unless otherwise noted, the components of FIGS. 9A-9B may be the same as or generally similar to like-numbered components of FIGS. 8A-8D. For example, as with FIGS. 8A-8D, elongate fibers 322 can be grown so as to extend from the first conductive layer 321a, and a second nonconductive layer 310 can be deposited over and surround the elongate fibers 322, portions of the first conductive layer 321a, and overlie portions of the first nonconductive layer 308. The second conductive layer 321b can be deposited over the second nonconductive layer 310, thus surrounding upper and side surfaces of the second non-conductive layer 310 that surround the elongate fibers 322, and overlie portions of the first nonconductive layer 308.

Unlike the embodiment shown in FIGS. 8A-8D, however, in FIGS. 9A-9B, additional alternating layers of nonconductive and conductive layers can be provided over the second conductive layer 321b to build a larger capacitor 305 with improved or desired capacitance properties. In some embodiments, the structure of FIGS. 9A-9C can comprise a single larger capacitor as compared with other implementations. In other embodiments, the structure of FIGS. 9A-9C can serve as two back-to-back capacitors around the fibers 322. For example, in various embodiments, a fourth nonconductive layer 311 can be provided (e.g., deposited) over the second conductive layer 321b. The fourth nonconductive layer 311 can comprise any suitable nonconductive material, and may be the same material or a different material from the first, second, and third nonconductive layers 308, 310, 309. A third conductive layer 321c can be provided (e.g., deposited) over the fourth nonconductive layer 311 to define a third terminal of the capacitor 305, with the fourth nonconductive layer 311 serving as the intervening dielectric between the second and third conductive layers 321b, 321c. As shown at the left edges of each capacitor structure 305, the conductive layers 321a, 321b, 321c can be patterned to have staggered terminations to facilitate subsequent separate contact. For example, as shown in the top view of FIG. 9C, each conductive layer 321a, 321b, 321c can include a laterally-extending tab portion 350 that extends laterally to make contact with corresponding terminals 331a, 331b, 331c that are connected or formed with corresponding conductive vias 336a, 336b, 336c. Although the tab portions 350 shown in FIG. 9C have respective widths less than widths of the capacitors 306, in other arrangements, the tab portions 350 can be significantly wider, e.g., wider than the capacitor 305, as wide as the capacitor 305, or slightly narrower than the capacitor 305. The middle conductive layer 321b can serve as a common storage electrode for the two back-to-back capacitors, while the outer conductive layers 321a, 321c can serve as reference electrodes.

As with FIGS. 8C-8D, the third nonconductive layer 309 (not shown) can be applied over the third conductive layer 321c such that the capacitor 305 is completely embedded in nonconductive material. Any number of alternating nonconductive and conductive layers can be additionally provided over the third conductive layer 321c to build up any suitable number of capacitive layers. Contacts can be provided through the third nonconductive layer 309 to separately land on and contact each of the conductive layers 321a, 321b, 321c at the tab portions 350. Providing the tab portions 350 at separate locations about the periphery of the capacitor 305 can beneficially enable the vias 336a-336c to electrically contact the respective layers 321a-321c without shorting. The use of additional capacitive layers as compared with the embodiment of FIGS. 8A-8D can further improve or increase the capacitance properties of the passive electronic component 3.

Figures 10A, 10B, 10C:
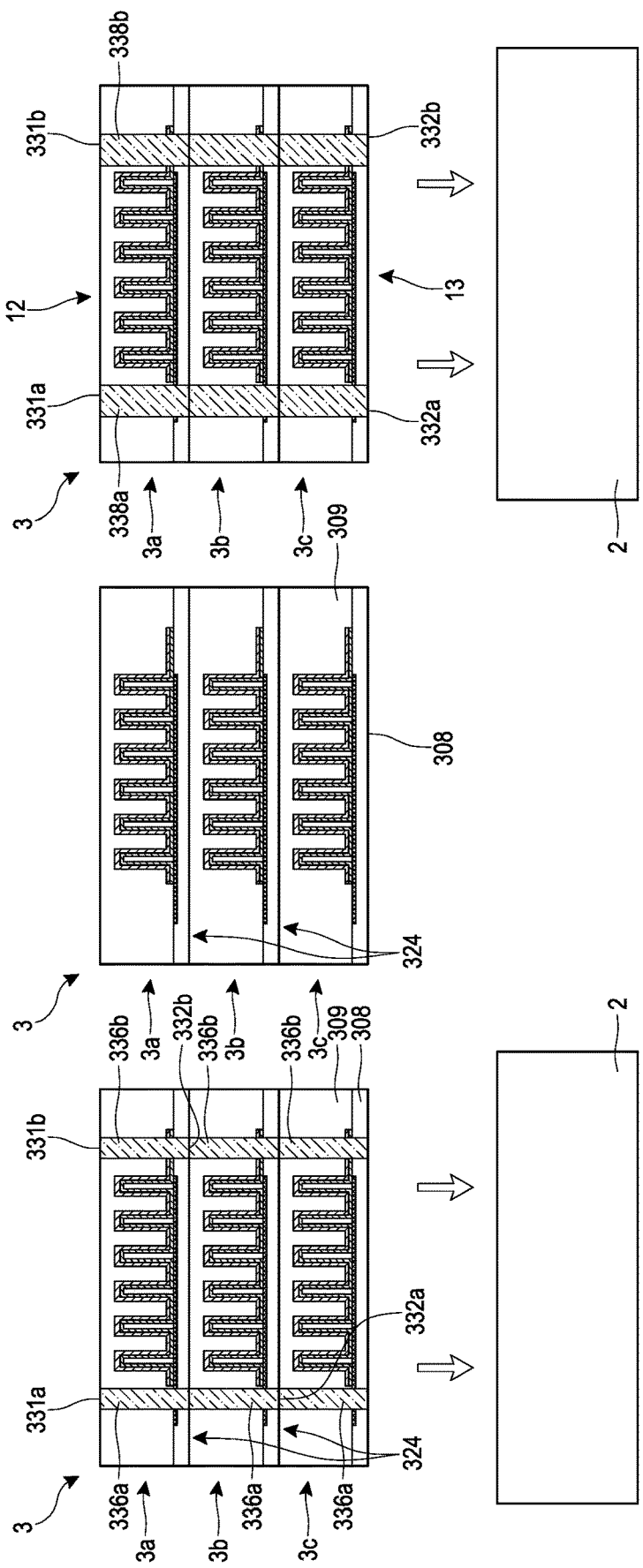
FIG. 10A is a schematic side sectional view of a stacked and bonded passive electronic component in which conductive vias are formed through each passive component prior to bonding.
FIG. 10B is a schematic side sectional view of a stacked and bonded passive electronic component, according to various embodiments.
FIG. 10C is a schematic side sectional view of the stacked and bonded passive electronic component of FIG. 10B after conductive vias are formed through the stacked and bonded passive electronic component.

FIGS. 10A-10E illustrate various embodiments for electrically connecting to the electrodes of the passive electronic component 3 and for mounting the passive electronic component 3 to an element 2. FIG. 10A is a schematic side sectional view of a passive electronic component that includes a plurality of bonded passive components 3a, 3b, 3c bonded to one another, according to one embodiment. In the embodiment of FIG. 10A, each passive component 3a, 3b, 3c may be generally similar to the leftmost capacitor 305a illustrated in FIG. 8D, which includes the first and second vias 336a, 336b, with terminals on both sides. In FIG. 10A, the passive components 3a-3c are directly bonded to one another without an intervening adhesive. In other embodiments, however, the passive components 3a-3c may be bonded with an adhesive.

For example, in the embodiment of FIG. 10A, the first bottom terminal 332a of a first passive component 3a can be directly bonded without an intervening adhesive to the first upper terminal 331a of a second passive component 3b. The second bottom terminal 332b of the first passive component 3a can be directly bonded without an intervening adhesive to the second upper terminal 331b of the second passive component 3b. The first nonconductive layer 308 of the first passive component 3a can be directly bonded to the third nonconductive layer 309 of the second passive component 3b.

Similarly, the first bottom terminal 332a of the second passive component 3b can be directly bonded without an intervening adhesive to the first upper terminal 331a of a third passive component 3c. The second bottom terminal 332b of the second passive component 3b can be directly bonded without an intervening adhesive to the second upper terminal 331b of the third passive component 3c. The first nonconductive layer 308 of the second passive component 3b can be directly bonded to the third nonconductive layer 309 of the third passive component 3c.

Thus, in the embodiment of FIG. 10A, the vias 336a, 336b of each component 3a-3c may be formed before the components 3a-3c are bonded to one another. The bonded passive electronic component 3 can be bonded to the element 2 without an intervening adhesive. For example, the first and second lower terminals 332a, 332b of the third component 3c can electrically connect to corresponding contacts on the element 2. The first nonconductive layer 308 of the third element 3c can be directly bonded to corresponding nonconductive field regions of the element 2. In other embodiments, an adhesive can be used to bond the bonded passive electronic component 3 to the element. The element 2 can comprise any suitable type of element, such as a semiconductor element. The element 2 can comprise, for example, an integrated device die (such as a processor die, memory die, etc.), a microelectromechanical systems die, a sensor die, an optical element, or any other suitable type of device. Further, although not shown in FIG. 10A, it should be appreciated that another element (such as a die, passive electronic component, etc.) can be bonded to the upper surface of the first element 3a, such that both opposing surfaces of the bonded electronic component 3 are connected to a corresponding element.

In FIG. 10A, a single stack of three passive components 3a-3c is shown, but it should be appreciated that any suitable number of passive components 3a-3c can be stacked and bonded to one another. For example, in some embodiments, the stack can include two or more than three stacked and bonded passive components. Moreover, in FIG. 10A, the stack of passive components 3a-3c is shown as being diced from a wafer or substrate prior to bonding to the element 2. In other embodiments, however, the passive electronic components can be bonded at the wafer-level, such that the bonded stack of passive components can include N layers (e.g., three (3) in FIG. 10A) of M laterally spaced passive components. The bonded stack of passive components can accordingly comprise a reconstituted wafer or substrate, which can then be bonded to a wafer or substrate that includes the active elements or integrated device dies. The bonded wafers can be diced after bonding in some embodiments. Skilled artisans would understand that still other arrangements may be suitable.

FIG. 10B is a schematic side sectional view of a passive electronic component 3 that includes a plurality of bonded passive components 3a-3c, according to another embodiment. In FIG. 10B, each passive component 3a-3c does not include the vias 336a, 336b prior to bonding. Rather, the passive components 3a-3c of FIG. 10B can be generally similar to or the same as the capacitors 305 of FIG. 8C, or the right side capacitors 305b, 305c of FIG. 8D, after removal of a sacrificial carrier 306. Thus, in FIG. 10B, the first nonconductive layer 308 of the first passive component 3a can be directly bonded to the third nonconductive layer 309 of the second passive component 3b. The first nonconductive layer 308 of the second passive component 3b can be directly bonded to the third nonconductive layer 309 of the third passive component 3c.

Turning to FIG. 10C, after bonding the passive components 3a-3c, first and second stack vias 338a, 338b can be provided through the stack of bonded passive components 3a-3c from the first surface 12 of the bonded passive electronic component 3 to the second surface 13 of the bonded passive electronic component 3. For example, openings can be formed (e.g., etched) through the stacked passive electronic component 3, and conductive material (e.g., a metal such as copper) can be provided seamlessly within the openings. The first stack via 338a can provide electrical communication from the terminals 331a, 332a to the respective first conductive layers 321a (e.g., the first electrodes) of the passive components 3a-3c. Similarly, the second stack via 338b can provide electrical communication from the terminals 331b, 332b to the respective second conductive layers 321b (e.g., the second electrodes) of the passive components 3a-3c. After forming the stack vias 338a, 338b, the bonded passive electronic component 3 can be directly bonded without an intervening adhesive to the element 2.

Figure 10E:
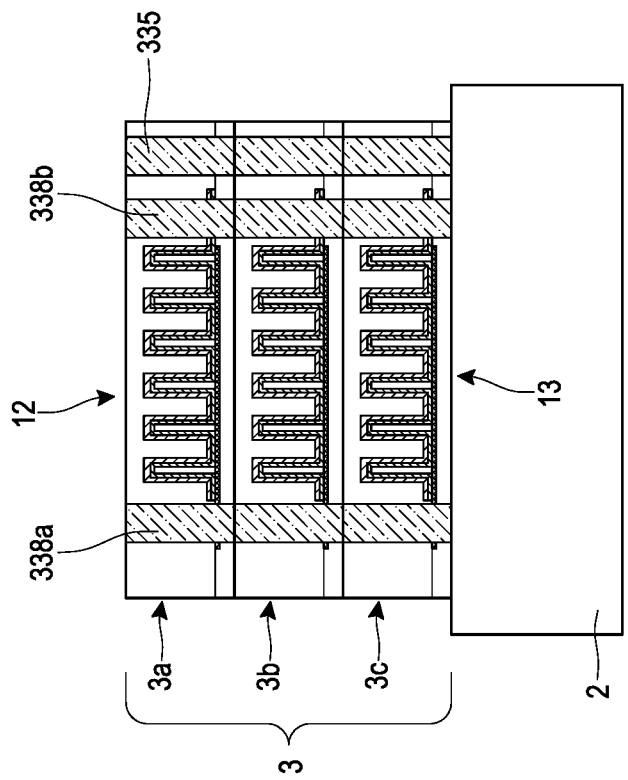
FIG. 10E is a schematic side sectional view of the bonded structure of FIG. 10D after conductive vias are formed through the passive electronic component.
Figure 10D:
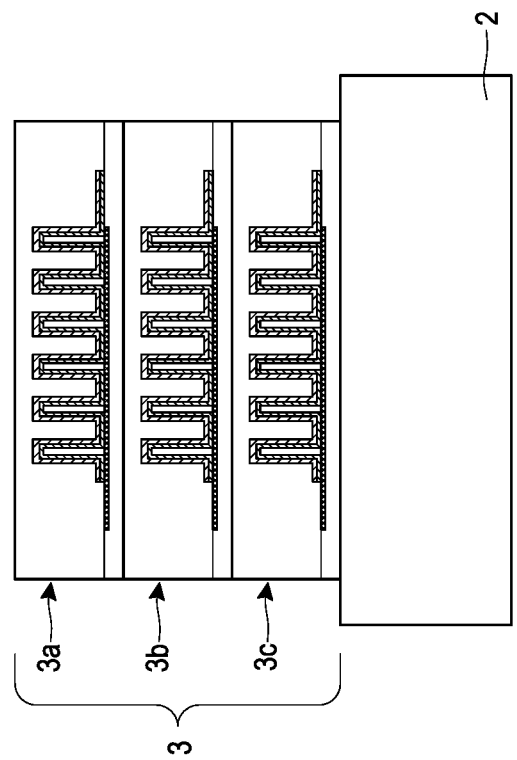
FIG. 10D is a schematic side sectional view of a bonded structure in which a stacked and bonded passive electronic component is directly bonded to an element.

FIGS. 10D-10E illustrate another technique for connecting the passive electronic component 3 to an element 2. In FIG. 10D, a stack of bonded passive components 3a-3c (similar to the bonded stack shown in FIG. 10B) can be bonded (e.g., directly bonded) to the element 2. After bonding the bonded passive electronic component 3 to the element 2, openings can be formed (e.g., etched) through the bonded passive electronic component 3, for example landing on contact pads of the underlying bonded element 2. A conductive material (e.g., a metal such as copper) can be provided within the openings to form respective stack vias 338a, 338b, which, as explained above, can provide electrical communication from the element 2 to the respective first and second conductive layers 321a, 321b of the components 3a-3c. In addition, as shown in FIG. 10E, a signal via 335 can also be formed through the bonded passive electronic component 3. The signal via 335 can comprise a pass-through via to convey signals from the first surface 12 of the passive electronic component 3 to the second surface 13 of the passive electronic component 3 and the element 2.

FIGS. 11A-11C illustrate various embodiments in which the passive electronic component 3 can be bonded to an element 2. FIG. 11A illustrates a passive electronic component 3 which can be generally similar to the passive electronic component 3 shown in FIG. 8D prior to being bonded to the element 2 (which can comprise an integrated device die, or any other suitable type of element, as explained above). As in FIG. 8D, some capacitors, such as capacitor 305a, can include vias 336a, 336b pre-formed through the first and third nonconductive materials 308, 309. Other capacitors, such as capacitors 305b, 305c, may not include pre-formed vias.

The element 2 and the passive electronic component 3 can be prepared for bonding, and can be directly bonded to one another without an intervening adhesive as shown in FIG. 11B. For example, nonconductive field regions of the element 2 can be directly bonded without an adhesive to the third layer 309 of the passive electronic component. Corresponding conductive contacts of the element 2 can be directly bonded to the terminals 331a, 331b which connect to the vias 336a, 336b of the passive component 3. Further, as shown in FIG. 11B, the carrier 306 can be removed after bonding in various embodiments. The carrier 306 can be removed in any suitable manner, for example, by grinding, polishing, chemical removal (e.g., etching), etc. The removal process may leave protruding portions of the previously formed vias 336a, 336b.

In FIG. 11C, to provide electrical communication to the conductive layers 321, 321b of the capacitors 305b, 305c, vias 337a, 337b can be provided after the passive electronic component 3 has been bonded to the element 2 in a via-last process. For example, as shown in FIG. 11C, openings can be formed (e.g., etched) into the second surface 13 of the passive electronic component 3 through the first and third nonconductive layers 308, 309. Conductive material can be deposited within the openings to form the vias 337a, 337b. Depending upon the fill process, excess conductive material on the second surface 13 of the passive electronic component 3 can be polished or planarized to leave a planar surface. Thus, as shown in FIGS. 11A-11C, the vias 336a, 336b can be formed in the passive electronic component 3 prior to bonding to the element 2. By contrast, the vias 337a, 337b can be formed in the passive electronic component 3 after bonding to the element 2. The skilled artisan will understand that, in other embodiments, all of the capacitors 305 can have the previously formed vias 336a, 336b of the left side capacitor 305a, or all of the capacitors 305 can have the via-last vias 337a, 337b of the right side capacitors 305b, 305c.

Figure 12A:
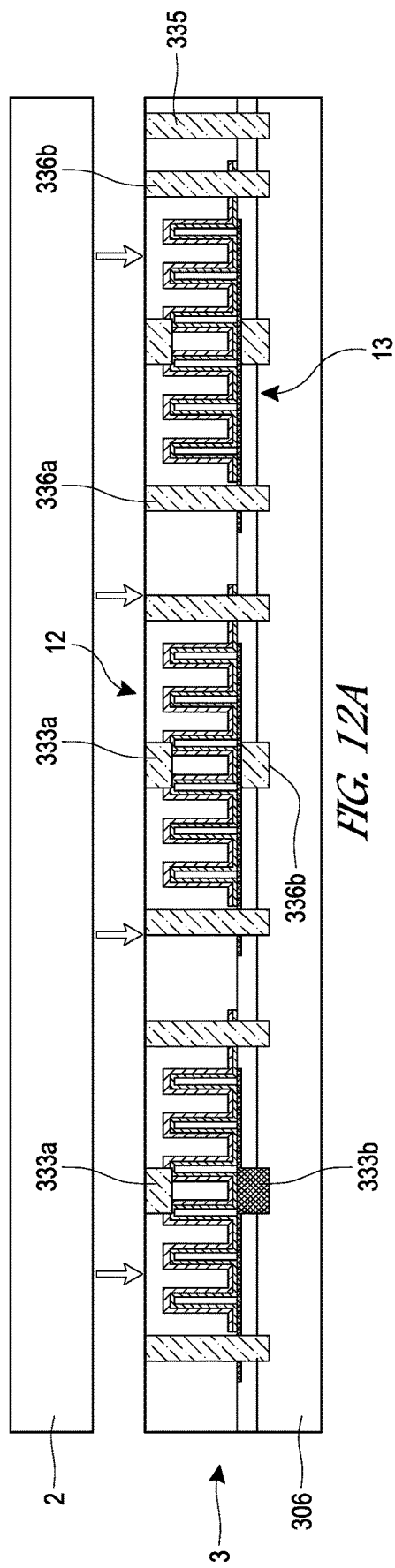
FIG. 12A is a schematic side sectional view of a passive electronic component that includes multiple contacts per surface and an element prior to bonding, according to another embodiment.
Figure 12B:
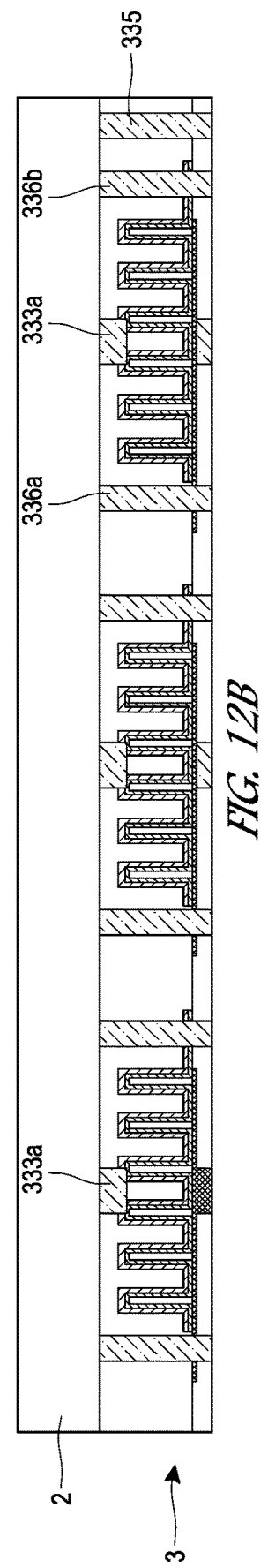
FIG. 12B is a schematic side sectional view of the passive electronic component and element of FIG. 12A after bonding.

FIGS. 12A-12B illustrate another embodiment of the passive electronic component 3, in which multiple contacts or terminals may be provided at the surfaces 12 or 13 of the component 3. Unless otherwise noted, the components of FIGS. 12A-12B may be generally similar to like-numbered components of FIGS. 11A-11C. For example, as with FIGS. 11A-11C, the element 2 and the passive electronic component 3 can be prepared for direct bonding as shown in FIG. 12A. Further, the passive component 3 can include the first and second vias 336a, 336b for each capacitor 305 to provide electrical communication to the first and second conductive layers 321a, 321b, respectively. Unlike the embodiment of FIGS. 11A-11C, however, in FIGS. 12A-12B, an additional first conductive contact 333a can be provided at or near the first surface 12 to electrically connect to the second conductive layer 321b. Similarly, an additional second conductive contact 333b can be provided at or near the second surface 13 to electrically connect to the first conductive layer 321a. In some embodiments, recesses can be formed (e.g., etched) in the third and first nonconductive layers 309, 308, and the contacts 333a, 333b can be provided in the recesses. The embodiment of FIGS. 12A-12B can accordingly enable the use of multiple contacts per surface of the passive electronic component to provide additional options for access to the terminals for the element 2 or for other external devices. In FIG. 12B, the element 2 can be directly bonded to the passive electronic component 3 as explained above. The carrier 306 can be removed from the element 2. The embodiment of FIG. 12B also shows a pass-through signal via 335. The skilled artisan will appreciate that, in other embodiments, the embedded contact 333a can obviate the second via 336b to the same capacitor electrode, such that in other embodiments the second via 336b can be omitted; and the embedded contact 333b can obviate the first via 336a to the same capacitor electrode, such that in other embodiments the first via 336a can be omitted.

Figure 13A:
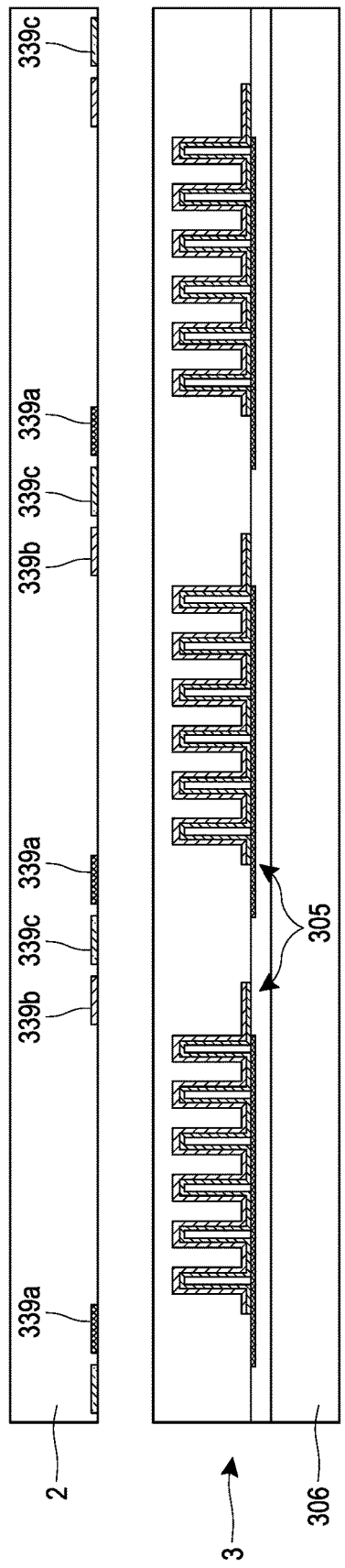
FIG. 13A is a schematic side sectional view of a passive electronic component that does not include pre-formed vias and an element before bonding.
Figure 13B:
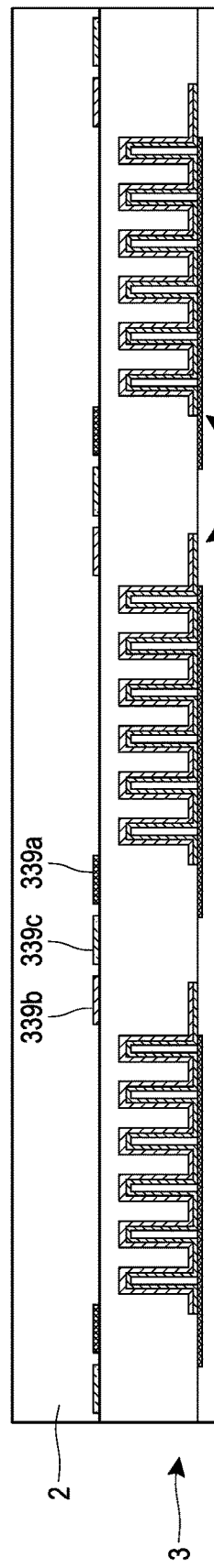
FIG. 13B is a schematic side sectional view of the passive electronic component and element of FIG. 13A after bonding.
Figure 13C:
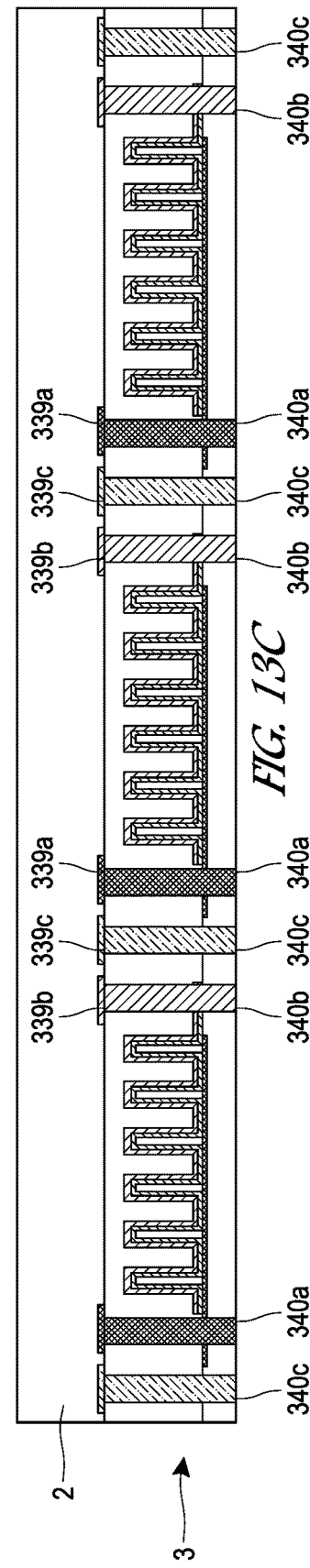
FIG. 13C is a schematic side sectional view of the passive electronic component and element of FIG. 13B after forming a plurality of conductive vias through the passive electronic component.

FIGS. 13A-13C illustrate another embodiment of connecting the passive electronic component 3 to an element 2. FIG. 13A illustrates a passive electronic component 3 before bonding to the element 2. The passive electronic component 3 includes capacitors 305 similar to, for example, the capacitors 305 of FIG. 8C, or the capacitors 305b, 305c shown in FIGS. 8D and 11A-11B that do not include pre-formed vias. The element 2 can comprise electrical contacts 339a, 339b, and 339c exposed at a lower surface of the element 2. A first electrical contact 339a can be configured to electrically communicate with the first conductive layer 321a (e.g., a first electrode of the capacitor 305). A second electrical contact 339b can be configured to electrically communicate with the second conductive layer 321b (e.g., a second electrode of the capacitor 305). A third electrical contact 339c can be configured to transmit or receive electrical signals through the passive electronic component 3 without connecting to the capacitors 305.

Turning to FIG. 13B, the element 2 can be directly bonded to the passive electronic component 3 (e.g., bonded to the third nonconductive layer 309) without an intervening adhesive. As above, the carrier 306 can be removed from the passive electronic component 3 after bonding to the element 2. In FIG. 13C, openings can be formed through the first and third nonconductive layers 308, 309, and conductive material can be provided in the openings to form conductive vias 340a-340c. First vias 340a can electrically connect to the first electrical contacts 339a and can extend from the first contacts 339a to the second surface 13 of the passive electronic component 3. The first vias 340a can provide electrical communication from the first contacts 339a to the first conductive layer 321a (e.g., the first electrodes of the capacitors 305) and from the second surface 13 to the first conductive layer 321a. Second vias 340b can electrically connect to the second electrical contacts 339b and can extend from the second contacts 339b to the second surface 13 of the passive electronic component 3. The second vias 340b can provide electrical communication from the second contacts 339b to the second conductive layer 321b (e.g., the second electrodes of the capacitors 305) and from the second surface 13 to the second conductive layer 321b. Third vias 340c can electrically connect to the third electrical contacts 339c and can extend from the third contacts 339c to the second surface 13 of the passive electronic component 3. The third vias 340c can comprise pass-through signal vias that do not connect to the capacitors 305.

Figure 14:
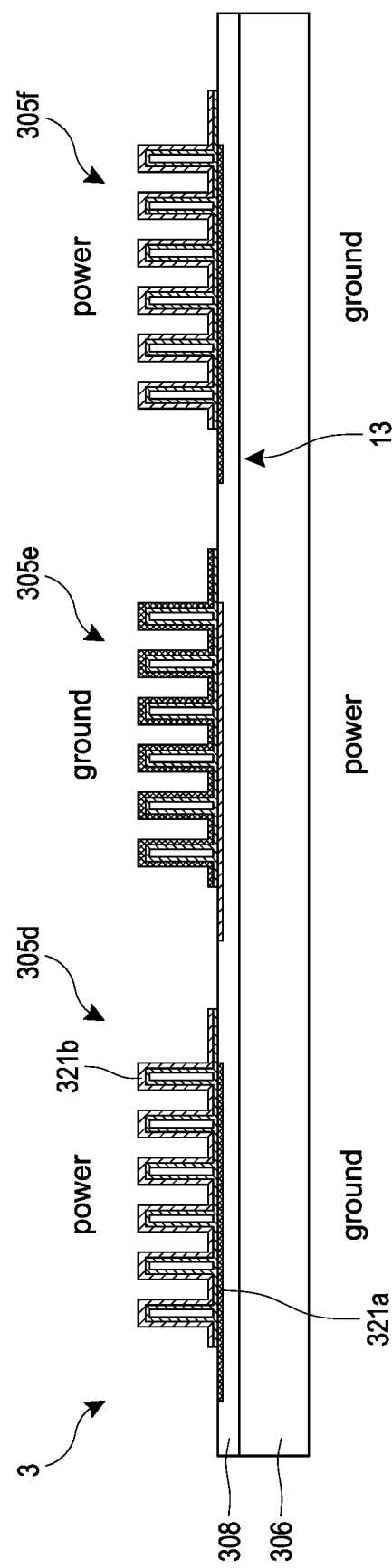
FIG. 14 is a schematic side sectional view of a partially-fabricated passive electronic component in which power and ground connections can be formed on both sides of the component.

FIG. 14 is a schematic side sectional view of a partially-fabricated passive electronic component 3 in which power and ground connections can be formed on both sides of the component 3. Unless otherwise noted, the components of FIG. 14 may be the same as or generally similar to like-numbered components of FIGS. 8A-13C. As shown in FIG. 14, the passive electronic component 3 can include capacitors 305d, 305e, and 305f, which may be similar to any of the capacitors 305 described above. As shown in FIG. 14, however, the capacitors 305d and 305f can include power terminals at or near the first surface 12 of the passive electronic component 3 (third nonconductive layer 309 not shown in FIG. 14), and ground terminals at or near the second surface 13 of the passive electronic component. By contrast, the capacitor 305e can include power terminals at or near the second surface 13 of the passive electronic component 3, and ground terminals at or near the first surface 12 of the passive electronic component 3. In the illustrated embodiment, each surface 12, 13 of the passive electronic component 3 can comprise alternative power and ground connections configured to connect to corresponding power and ground connections of other elements in a stacking arrangement. Accordingly, in the embodiment of FIG. 14, external devices can access both power and ground along the same side of the passive electronic component 3.

As explained herein, various types of elements, such as dies or wafers, may be stacked in a three-dimensional arrangement as part of various microelectronic packaging schemes. This can include stacking a layer of one or more dies or wafers on a larger base die or wafer, stacking multiple dies or wafers in a vertical arrangement, and various combinations of both. Dies in the stacks can include memory devices, logic devices, processors, discrete devices, and the like. In various embodiments disclosed herein, very small or thin profile capacitors can be embedded within an insulating material and can be included in a stacked die arrangement, to decouple adjacent bonded devices, for example.

Dies or wafers may be bonded in a stacked arrangement using various bonding techniques, including direct bonding, non-adhesive techniques such as the direct bonding techniques disclosed above (see for example, U.S. Pat. No. 7,485,968, which is incorporated by reference herein in its entirety). When bonding stacked dies using a direct bonding technique, it is desirable that the surfaces of the dies to be bonded be extremely flat and smooth. For instance, as explained above, the surfaces should have a very low variance in surface topology, so that the surfaces can be closely mated to form a lasting bond. It is also desirable that the surfaces be clean and free from impurities, particles, or other residue.

Figure 15:
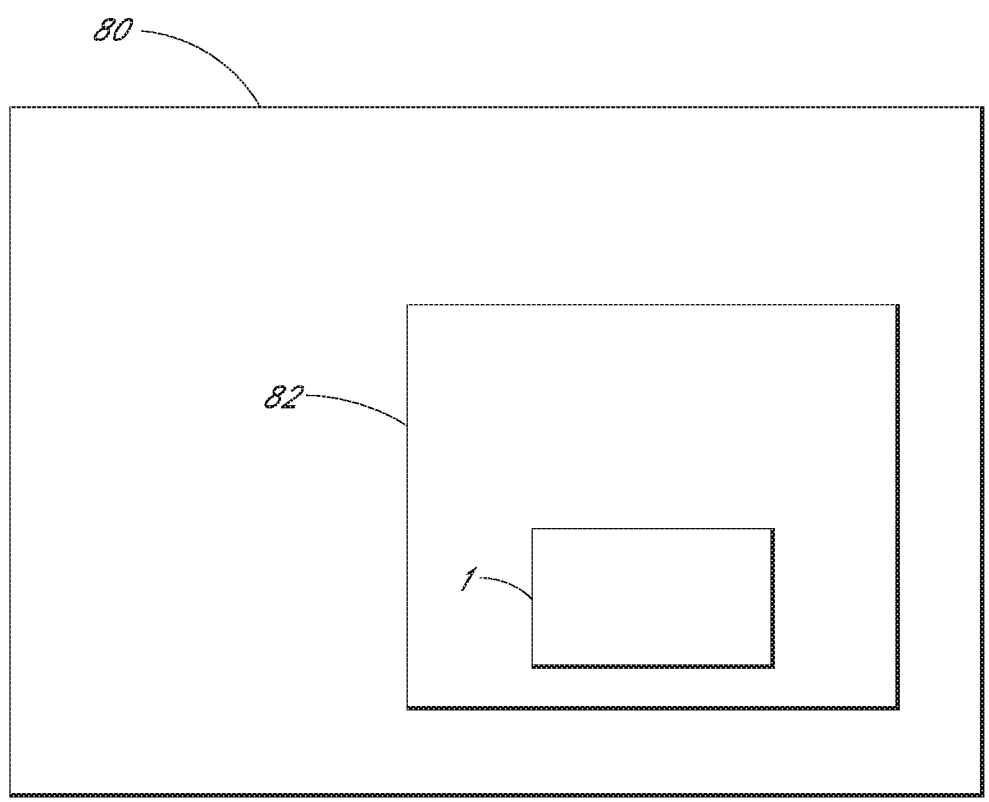
FIG. 15 is a schematic system diagram of an electronic system incorporating one or more bonded structures, according to various embodiments.

FIG. 15 is a schematic system diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The system 80 shown in FIG. 15 can comprise any of the structures 1, elements 2, and passive components 3 shown and described herein.

In one embodiment, a passive electronic component having a first surface and a second surface opposite the first surface is disclosed. The passive electronic component can include a nonconductive material and a capacitor embedded within the nonconductive material. The capacitor can have a first electrode, a second electrode, and a dielectric material disposed between the first and second electrodes. The first electrode can include a first conductive layer and a plurality of elongate conductors extending from and electrically connected to the first conductive layer. A first conductive via can extend through the passive electronic component from the first surface to the second surface, the first conductive via electrically connected to the first electrode.

In another embodiment, a passive electronic component having a first surface and a second surface opposite the first surface is disclosed. The passive electronic component can include a first conductive layer and a plurality of conductive fibers extending from the first conductive layer. The passive electronic component can include a dielectric layer conformally coating the conductive fibers. The passive electronic component can include a second conductive layer conformally coating the dielectric layer. The passive electronic component can include a first terminal on the first surface of the passive electronic component, the first terminal electrically connected to the first conductive layer. The passive electronic component can include a second terminal on the first surface of the passive electronic component, the second terminal electrically connected to the second conductive layer.

In another embodiment, a method of forming a bonded structure is disclosed. The method can include providing a capacitor embedded within a nonconductive material. The capacitor can have a first electrode, a second electrode, and a dielectric material disposed between the first and second electrodes. The first electrode can include a first conductive layer and a plurality of elongate conductors extending from and electrically connected to the first conductive layer. The method can include providing a first conductive via that extends through the passive electronic component from the first surface to the second surface, the first conductive via electrically connected to the first electrode. The method can include directly bonding the passive electronic component to an element without an intervening adhesive.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A passive electronic component having a first surface and a second surface opposite the first surface, the passive electronic component comprising:
    a nonconductive material, a capacitor embedded within the nonconductive material, the capacitor having a first electrode, a second electrode, and a dielectric material disposed between the first and second electrodes, the first electrode comprising a first conductive layer and a plurality of elongate conductors extending vertically from and electrically connected to the first conductive layer, the plurality of elongate conductors comprising a different material from the first conductive layer, the plurality of elongate conductors each having a maximum horizontal dimension and a maximum vertical dimension greater than the maximum horizontal dimension, the maximum horizontal dimension being the maximum dimension of each elongate conductor in all horizontal directions, the first conductive layer extends at least between two adjacent conductors of the plurality of elongate conductors, the plurality of elongate conductors comprising a first plurality of conductors arranged laterally along a first direction on a surface of the first conductive layer and a second plurality of conductors arranged laterally along a second direction on the surface of the first conductive layer non-parallel with the first direction;
    a first conductive via extending through the passive electronic component vertically from the first surface to the second surface, the first conductive via electrically connected to the first electrode;
    a first conductive contact at the first surface, the first conductive contact electrically connected to the second electrode; and
    a second conductive contact at the second surface, the second conductive contact electrically connected to the first electrode,
    wherein the plurality of elongate conductors comprise a plurality of conductive fibers.

2. The passive electronic component of claim 1, wherein the maximum horizontal dimension is less than 150 nm.

3. The passive electronic component of claim 1, further comprising a second conductive via extending through the passive electronic component from the first surface to the second surface, the second conductive via electrically connected to the second electrode.

4. The passive electronic component of claim 3, further comprising a first terminal formed with or electrically connected to the first conductive via and a second terminal formed with or electrically connected to the second conductive via, the first and second terminals exposed at or near the first surface of the passive electronic component.

5. The passive electronic component of claim 4, wherein the first terminal is configured to connect to one or more power sources and the second terminal is configured to connect to one or more electrical ground sources.

6. The passive electronic component of claim 1, wherein the nonconductive material comprises a first nonconductive layer, the first conductive layer being formed on the first nonconductive layer.

7. The passive electronic component of claim 6, wherein the dielectric material comprises a second nonconductive layer formed over the plurality of elongate conductors, the nonconductive material further comprising a third nonconductive layer provided over a second conductive layer of the second electrode.

8. The passive electronic component of claim 7, wherein portions of the third nonconductive layer are disposed between laterally adjacent portions of the second conductive layer.

9. The passive electronic component of claim 7, further comprising a fourth nonconductive layer over the second conductive layer and a third conductive layer over the fourth nonconductive layer, the third nonconductive layer disposed over the third conductive layer.

10. A bonded structure comprising an element and the passive electronic component of claim 1, the element having a nonconductive region and a conductive feature directly bonded to a corresponding nonconductive region and a corresponding conductive feature of the passive electronic component without an intervening adhesive.

11. The bonded structure of claim 10, wherein the element comprises an integrated device die.

12. The bonded structure of claim 10, wherein the passive electronic component comprises a plurality of passive components directly bonded and stacked to one another.

13. The bonded structure of claim 12, wherein each passive component of the plurality of passive components comprises a corresponding conductive via, respective terminals of the corresponding conductive vias directly bonded to one another to define the first conductive via.

14. The bonded structure of claim 12, wherein the first conductive via extends seamlessly through an opening formed through the plurality of passive components.

15. The bonded structure of claim 10, further comprising a through signal via formed through the passive electronic component.

16. The passive electronic component of claim 2, wherein the plurality of conductive fibers comprise a plurality of carbon nanotubes.

17. A passive electronic component having a first surface and a second surface opposite the first surface, the passive electronic component comprising:
    a nonconductive material;
    a capacitor embedded within the nonconductive material, the capacitor having a first electrode, a second electrode, and a dielectric material disposed between the first and second electrodes, the first electrode comprising a first conductive layer and a plurality of elongate conductors extending vertically from and electrically connected to the first conductive layer, the plurality of elongate conductors comprising a different material from the first conductive layer, the plurality of elongate conductors each having a maximum horizontal dimension and a maximum vertical dimension greater than the maximum horizontal dimension, the maximum horizontal dimension being the maximum dimension of each elongate conductor in all horizontal directions;

a first conductive via extending through the passive electronic component vertically from the first surface to the second surface, the first conductive via electrically connected to the first electrode;

a first conductive contact at the first surface, the first conductive contact electrically connected to the second electrode;

a second conductive contact at the second surface, the second conductive contact electrically connected to the first electrode;

a second conductive via extending through the passive electronic component from the first surface to the second surface, the second conductive via electrically connected to the second electrode;

a first terminal formed with or electrically connected to the first conductive via and a second terminal formed with or electrically connected to the second conductive via, the first and second terminals exposed at or near the first surface of the passive electronic component;

a third terminal formed with or electrically connected to the first conductive via and a fourth terminal formed with or electrically connected to the second conductive via, the third and fourth terminals exposed at or near the second surface of the passive electronic component.

18. A passive electronic component having a first surface and a second surface opposite the first surface, the passive electronic component comprising:

a first conductive layer;

a plurality of conductive fibers extending from a surface of the first conductive layer such that a first plurality of conductive fibers are arranged laterally along a first direction on the surface of the first conductive layer and a second plurality of conductive fibers are arranged laterally along a second direction on the surface of the first conductive layer non-parallel with the first direction, the plurality of conductive fibers each having a maximum horizontal dimension and a maximum vertical dimension greater than the maximum horizontal dimension, the maximum horizontal dimension being the maximum dimension of each conductive fiber in all horizontal directions, the first conductive layer extends at least between two adjacent conductors of the plurality of conductive fibers;

a dielectric layer conformally coating the conductive fibers;

a second conductive layer conformally coating the dielectric layer;

a first terminal on the first surface of the passive electronic component, the first terminal electrically connected to the first conductive layer;

a second terminal on the first surface of the passive electronic component, the second terminal electrically connected to the second conductive layer; and a third terminal on the second surface of the passive electronic component, the third terminal electrically connected to the first conductive layer.

19. The passive electronic component of claim 18, further comprising a nonconductive layer conformally coating the second conductive layer, the nonconductive layer disposed between at least two adjacent conductive fibers.

20. The passive electronic component of claim 18, wherein at least two of the plurality of conductive fibers are oriented non-parallel relative to one another.

21. The passive electronic component of claim 18, further comprising a first conductive via connected to the first terminal and extending through the passive electronic component from the first surface to the second surface, and a second conductive via connected to the second terminal and extending through the passive electronic component from the first surface to the second surface.

22. The passive electronic component of claim 18, wherein the plurality of conductive fibers comprise a plurality of carbon fibers.

23. The passive electronic component of claim 18, further comprising a fourth terminal on the first surface of the passive electronic component, the fourth terminal electrically connected to a portion of the second conductive layer that is closer to the first surface than to the second surface, the fourth terminal laterally spaced from the second terminal.

24. A method of forming a bonded structure, the method comprising:

providing a passive electronic component having a capacitor embedded within a nonconductive material, the capacitor having a first electrode, a second electrode, and a dielectric material disposed between the first and second electrodes, the first electrode comprising a first conductive layer and a plurality of elongate conductors extending from and electrically connected to the first conductive layer, the plurality of elongate conductors each having a maximum horizontal dimension and a maximum vertical dimension greater than the maximum horizontal dimension, the maximum horizontal dimension being the maximum dimension of each elongate conductor in all horizontal directions, the first conductive layer extends at least between two adjacent conductors of the plurality of elongate conductors, a first capacitance defined between the first layer and the second electrode and a second capacitance defined between the plurality of elongate conductors and the second electrode, the plurality of elongate conductors comprising a first plurality of conductors arranged laterally along a first direction on a surface of the first conductive layer and a second plurality of conductors arranged laterally along a second direction on the surface of the first conductive layer non-parallel with the first direction;

providing a first conductive via that extends through the passive electronic component vertically from a first surface to a second surface of the passive electronic component, the first conductive via electrically connected to the first electrode; and directly bonding the passive electronic component to an integrated device die without an intervening adhesive, wherein the providing the passive electronic component comprises growing the plurality of elongate conductors on the first conductive layer, and wherein the passive electronic component comprises a first conductive contact at the first surface that is electrically connected to the second electrode and a second conductive contact at the second surface that is electrically connected to the first electrode.

25. The method of claim 24, wherein the plurality of elongate conductors comprise a plurality of conductive fibers.

26. The method of claim 24, wherein the providing the passive electronic component comprises conformally depositing the dielectric material over the first electrode, and conformally depositing the second electrode over the dielectric material.

\* \* \* \* \*